(12) United States Patent
Peri et al.

(10) Patent No.: US 6,904,400 B1
(45) Date of Patent: Jun. 7, 2005

(54) FLASH EEPROM MEMORY EMULATOR OF NON-FLASH EEPROM DEVICE AND CORRESPONDING METHOD

(75) Inventors: Maurizio Peri, Bergamo (IT); Alessandro Brigati, Castel S. Giovanni (IT); Marco Olivo, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/265,119

(22) Filed: Mar. 9, 1999

(30) Foreign Application Priority Data

Sep. 30, 1998 (EP) .............................................. 98203302

(51) Int. Cl.$^7$ ......................... G06F 9/455; G06F 12/00; G06F 12/14; G06F 12/16; G11C 16/04

(52) U.S. Cl. ........................ 703/28; 703/23; 365/185.3; 711/103; 711/170; 711/171; 711/172; 711/173

(58) Field of Search .................. 703/23, 28; 365/185.3; 711/103, 170–173

(56) References Cited

U.S. PATENT DOCUMENTS

| | | | | |
|---|---|---|---|---|
| 5,309,402 A | * | 5/1994 | Okazawa ..................... 365/218 |
| 5,357,475 A | * | 10/1994 | Hasbun et al. ............... 711/103 |
| 5,508,971 A | * | 4/1996 | Cernea et al. .......... 365/185.14 |
| 5,561,632 A | * | 10/1996 | Arase et al. ........... 365/185.33 |
| 5,574,684 A | * | 11/1996 | Tomoeda ............... 365/185.04 |
| 5,581,503 A | * | 12/1996 | Matsubara et al. .... 365/185.33 |
| 5,596,528 A | * | 1/1997 | Cernea et al. .......... 365/185.18 |
| 5,603,001 A | * | 2/1997 | Sukegawa et al. .......... 711/103 |
| 5,650,962 A | * | 7/1997 | Arase ....................... 365/185.3 |
| 5,651,128 A | | 7/1997 | Gaultier ....................... 395/430 |
| 5,654,922 A | * | 8/1997 | Arase et al. ........... 365/185.09 |
| 5,663,901 A | * | 9/1997 | Wallace et al. ......... 365/185.11 |
| 5,682,497 A | * | 10/1997 | Robinson ..................... 711/103 |
| 5,687,345 A | * | 11/1997 | Matsubara et al. .......... 711/103 |
| 5,699,546 A | * | 12/1997 | Nishikata et al. ........... 711/103 |
| 5,712,815 A | * | 1/1998 | Bill et al. ............... 365/185.03 |
| 5,748,538 A | * | 5/1998 | Lee et al. ............... 365/185.06 |
| 5,777,923 A | * | 7/1998 | Lee et al. ............... 365/185.11 |
| 5,796,657 A | * | 8/1998 | Lee et al. ............... 365/185.11 |
| 5,872,994 A | * | 2/1999 | Akiyama et al. ....... 365/185.33 |
| 5,912,848 A | * | 6/1999 | Bothwell ............... 365/185.29 |
| 5,937,423 A | * | 8/1999 | Robinson ..................... 365/52 |
| 5,937,434 A | * | 8/1999 | Hasbun et al. ............... 711/170 |
| 5,953,255 A | * | 9/1999 | Lee ......................... 365/185.29 |
| 5,956,268 A | * | 9/1999 | Lee ......................... 365/185.03 |
| 5,966,723 A | * | 10/1999 | James et al. ................. 711/103 |
| 5,991,199 A | * | 11/1999 | Brigati et al. ........... 365/185.11 |
| 5,991,204 A | * | 11/1999 | Chang .................... 365/185.29 |
| 6,011,717 A | * | 1/2000 | Brigati et al. ........... 365/185.05 |
| 6,043,530 A | * | 3/2000 | Chang ......................... 257/320 |
| 6,092,160 A | * | 7/2000 | Marsters ................. 365/185.11 |
| 6,141,254 A | * | 10/2000 | Devin et al. ............ 365/185.12 |
| 6,182,188 B1 | * | 1/2001 | Hasbun et al. ............... 711/103 |
| 6,275,960 B1 | * | 8/2001 | Cappelletti et al. .......... 714/718 |

FOREIGN PATENT DOCUMENTS

WO    WO 98/35344    * 8/1998

OTHER PUBLICATIONS

Kuo, C. et al. "A 32–bit RISC Microcontroller with 448K Bytes of Embedded Flash Memory." Proc. 7$^{th}$ Biennial IEEE Nonvolatile Memory Technology Conf., 1998.*

(Continued)

Primary Examiner—Kevin J. Teska
Assistant Examiner—Ayal Sharon
(74) Attorney, Agent, or Firm—Lisa K. Jorgenson; Robert Iannucci; Seed IP Law Group PLLC

(57) ABSTRACT

A method and device emulate the features of a EEPROM memory device. The device is included into a memory macrocell which is embedded into an integrated circuit comprising also a microcontroller. The device includes a Flash EEPROM memory structure formed by a predetermined number of sectors wherein at least two sectors of the Flash memory structure are used to emulate EEPROM byte alterability.

26 Claims, 18 Drawing Sheets

OTHER PUBLICATIONS

Yamada, S. et al. "A Self–Convergence Erase for NOR Flash EEPROM Using Avalanche Hot Carrier Injection". IEEE Transactions on Electron Devices. Nov. 1996. vol. 43, Issue 11. pp. 1937–1941.*

Baker, M. et al. "Non–volatile Memory for Fast, Reliable File Systems". Proc. 5th Int'l Conf. on Arch. Support for Prog. Lang. and Op. Sys. 1992. pp. 10–22.*

Kobayashi, S. et al. "Memory Array Architecture and Decoding Scheme for 3 V Only Sector Erasable DINOR Flash Memory." IEEE Journal of Solid–State Circuits. Apr. 1994. vol. 29, Issue 4. pp. 454–460.*

"Documents and files for family ST9". The ST MCU Support Site—Family Docs—ST9. Printed Jan. 10, 2003. http://www.stmcu.com/familiesdocs–ST90158M7–16.html.*

Andretta, F., Peri, M., Pozzi, C. "Testing of the ST9 Microcontroller", Proceedings of the 20th EUROMICRO Conference, 1994. Sep. 5–8, 1994. pp. 322–328.*

"Onwards and Upwards: New developments in 8–bit Micros". Challenge: News and Views from STMicroelectronics, Mar. 1999.*

Brown et al. "Simultaneous Code Execution and Data Storage in a Single Flash Memory Chip for Real Time Wireless Communication Systems". Proceedings of the 40th Midwest Symposium on Circuits and Systems, 1997. Aug. 3–6, 1997. pp. 740–745, vol. 2.*

Nakamura et al. "An Intelligent Subprocessor for Hardware Emulation with 20–MOPS performance." IEEE Journal of Solid–State Circuits. Nov. 1991. vol. 26, Issue 11. pp. 1662–1668.*

SGS–Thomson Microelectronics, "ST903x/4x Family 8/16 Bit MCU Databook", 1st Ed, May 1994.

STMicroelectronics, "Microcontroller Product Finder", dated 1998.

SGS–Thomson Microelectronics, CD–ROM entitled "Data on Disc," dated 1997.

SGS–Thomson Microelectronics, The ST9 8/16–bit Microcontroller Family catalog, dated 1994.

Declaration Under 37 C.F.R. Rule 1.1.32, Mar. 17, 2003.

Yvon Bahout, "Combined Flash and EEPROM Integrated Circuit," *Elektronik Industrie*, vol. 28, No. 10, pp. 48, 50–51, Oct. 1997.

ATMEL: Secure Microcontrollers—Data Sheets, "Secure Crytocontrollers for Smart Cards" ST90SCC Summary, pp. 1–4, Jun. 1998.

* cited by examiner

| 224000h | FCR |
| 224001h | ECR |
| 224002h | FSR |

*FIG. 3A*

| Sector | Addresses | Max Size |
|---|---|---|
| OTP | 211F80h to 211FFFh | 128 byte |
| Flash 0 | 000000h to 00FFFFh | 64 Kbyte |
| Flash 1 | 01000h to 01BFFFh | 48 Kbyte |
| Flash 2 | 01C000h to 01DFFFh | 8 Kbyte |
| Flash 3 | 01E000h to 01FFFFh | 8 Kbyte |
| EEprom | 220000h to 2203FFh | 1 Kbyte |

*FIG. 3B*

| 7 | 6 | 5 | 4 | 3 | 2 | 1 | 0 |
|---|---|---|---|---|---|---|---|
| FWMS | FPAGE | FCHIP | FBYTE | FSECT | FSUSP | PROT | FBUSY |

FIG. 3C

| 7 | 6 | 5 | 4 | 3 | 2 | 1 | 0 |
|---|---|---|---|---|---|---|---|
| EWMS | EPAGE | ECHIP | | | WFIS | FEIEN | EBUSY |

FIG. 3D

| 7 | 6 | 5 | 4 | 3 | 2 | 1 | 0 |
|---|---|---|---|---|---|---|---|
| FERR | FSS6 | FSS5 | FSS4 | FSS3 | FSS2 | FSS1 | FSS0 |

FIG. 3E

| | |
|---|---|
| 211FFCh | NVAPR |
| 211FFDh | NVWPR |
| 211FFEh | NVPWD0 |
| 211FFFh | NVPWD1 |

*FIG. 4A*

| Operation | Size | Min | Typ | Max |
|---|---|---|---|---|
| Page Update | 256 byte | 160 us | 10 ms | 30 ms |
| | 512 byte | 160 us | 15 ms | 50 ms |
| | 1 Kbyte | 160 us | 30ms | 100 ms |
| Chip Erase | 256 byte | | 35 ms | 100 ms |
| | 512 byte | | 45 ms | 150 ms |
| | 1 Kbyte | | 70 ms | 300 ms |

*FIG. 4B*

| 7 | 6 | 5 | 4 | 3 | 2 | 1 | 0 |
|---|---|---|---|---|---|---|---|
| APRA | APRO | APBR | APEE | APEX | PWT2 | PWT1 | PWT0 |

FIG. 4C

| 7 | 6 | 5 | 4 | 3 | 2 | 1 | 0 |
|---|---|---|---|---|---|---|---|
| TMDIS | PWOK | WPBR | WPEE | WPRS3 | WPRS2 | WPRS1 | WPRS0 |

FIG. 4D

| 7 | 6 | 5 | 4 | 3 | 2 | 1 | 0 |
|---|---|---|---|---|---|---|---|
| PWD7 | PWD6 | PWD5 | PWD4 | PWD3 | PWD2 | PWD1 | PWD0 |

FIG. 4E

FLASH EEPROM MEMORY EMULATOR OF NON-FLASH EEPROM DEVICE AND CORRESPONDING METHOD

TECHNICAL FIELD

The present invention relates to a method and device to emulate the features of an EEPROM memory device.

More specifically, the invention relates to an Emulated EEPROM memory device of the type included in a memory macrocell which is embedded in an integrated circuit comprising also a microcontroller and including a Flash EEPROM memory structure formed by a predetermined number of sectors.

The invention relates, particularly but not exclusively, to microcontroller electronic devices having an on-board resident memory. More specifically, the device may be a microcontroller or a microprocessor having a resident (on-board) and integrated memory macrocell circuit.

In the embodiment being described by way of example, the memory macrocell includes an embedded Flash memory portion to store programs and update codes for the microcontroller and an embedded EEPROM non-volatile memory portion to store data.

BACKGROUND OF THE INVENTION

As is well known, modern microcontrollers are provided with on-board memory circuits to store both programs and data on the same IC.

In this specific technical field there is a felt need to have at least an EEPROM portion of the memory macrocell to be used just as a non-volatile memory for parameter storage and for defining non-volatile pointers of the stored data.

However, Flash and EEPROM technologies are not compatible and the higher integration degree and much lower cost of the Flash devices would suggest to realize memory macrocell including just Flash memory cells.

The memory circuit structure should comprises three portions: a main Flash memory portion, a small OTP (One-Time-Programmable) portion and an EEPROM memory portion.

The Flash memory portion should include at least four sectors.

Flash and EEPROM portions have respective sense amplifiers so that one memory portion can be read while the other memory portion is written. However, simultaneous Flash and EEPROM write operations are not allowed. Also not allowed is erasing of the EEPROM portion while writing on the Flash portion.

Flash memory devices may be electrically erased by erasing the whole memory portion; while the EEPROMs may be erased on a byte by byte basis.

The memory macrocell has a register interface mapped in the memory area. All the operations are enabled through two control registers, one register FCR for the Flash (and OTP) portion operations and another one ECR for the EEPROM portion operations.

The status of a write operation inside the Flash portion can be monitored by a dedicated status register.

A known prior art solution allows the above operations by using an EEPROM software emulation addressing two Flash sectors which are dedicated to EEPROM emulation.

At each data update a pointer is added to find the new data. When a Flash sector is full all the data are swapped to the other sector. An unused sector is erased in background.

This solution presents good cycling performances in the same few bytes are continuously updated.

However, there are also some drawbacks which are listed hereinafter:

- the best emulation is obtained by a huge managing software, at least 20 Kbytes, which must be stored in the same memory circuit;
- it might be necessary to wait for erase suspend before accessing at the EEPROM for read and write operations;
- a long read access time has been found during experimentation.

SUMMARY OF THE INVENTION

A first object of the present invention is that of providing a new method for emulating an EEPROM memory portion by using a Flash memory portion.

A further object of the present invention is to provide an innovative system which allows a Flash memory portion to emulate EEPROM byte alterability.

Another object of the present invention is that of providing a memory device comprising a Flash memory portion which may be accessed as a EEPROM memory portion during read, write and erase operations.

A further object of the present invention is that of providing a microprocessor or a microcontroller having an on-board memory portion including Flash sectors emulating EEPROM byte alterability.

An embodiment of the invention provides an EEPROM hardware emulation of a Flash memory portion.

The embodiment includes an integrated memory device having at least two sectors of a Flash memory structure that are used to emulate EEPROM byte alterability.

The feature and advantages of inventive method and device will appear from the following non-limiting description of a preferred embodiment given by way of example with reference to the annexed drawings.

BRIEF DESCRIPTION OF THE DRAWINGS

FIG. 3A shows a simplified and schematic view of a register interface associated with the memory macrocell of FIG. 1.

FIG. 3B reports in a table form the addresses and size of each memory sector of the memory macrocell of FIG. 1.

FIGS. 3C, 3D and 3E show schematic views of a Flash Control Register, an EEPROM Control Register, and a Flash Status Register, respectively;

FIG. 4A shows a simplified and schematic view of a register interface associated with the EEPROM emulated portion of FIG. 1;

FIG. 4B reports in a table form the addresses and size of each EEPROM memory sector.

FIGS. 4C, 4D and 4E show a schematic view of a Flash Control Register, an EEPROM Control Register, and a Flash Status Register, respectively.

DETAILED DESCRIPTION

Figure 1:
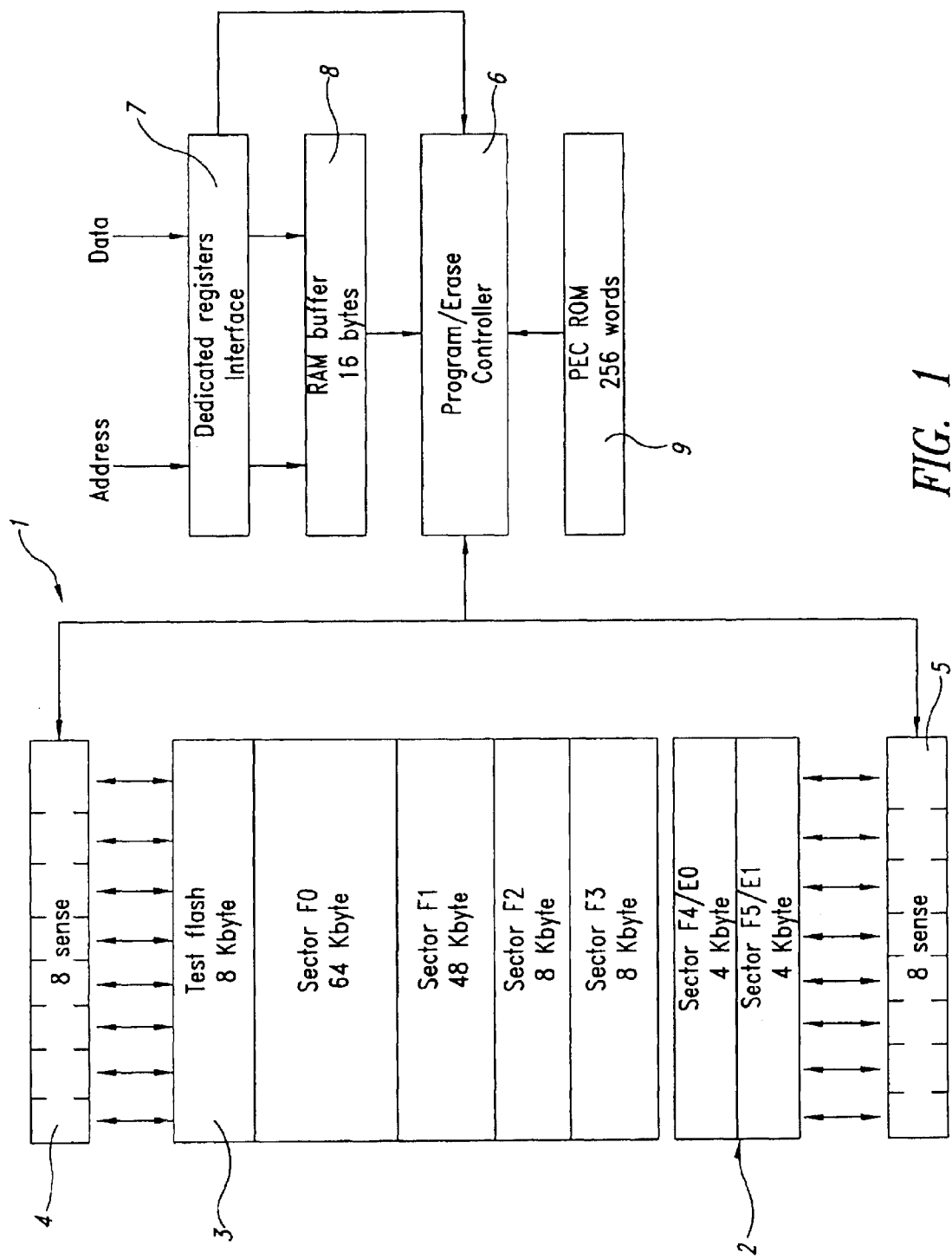
FIG. 1 shows a schematic diagram of a memory macrocell including a Flash memory portion and an EEPROM hardware emulation according to an embodiment of the present invention.

With reference to the annexed drawing, with 1 is globally indicated a memory macrocell which is realized according to an embodiment of the present invention by a Flash EEPROM memory structure including an emulated EEPROM memory portion 2.

The memory macrocell 1 is embedded into an integrated circuit comprising also a microcontroller. The invention is specifically, but not exclusively, provided for an integrated microcontroller having an on-board non-volatile memory portion.

However, the principles of the invention may also be applied to an integrated memory circuit structure.

The memory macrocell 1 comprises a main 128 Kbyte Flash memory structure formed by a predetermined number of sectors, two of which are used to emulate EEPROM byte alterability. More specifically 8 Kbyte of the Flash memory portion are used to emulate 1 Kbyte of an EEPROM memory portion.

Four sectors are provided for the Flash memory portion: a first 64 Kbyte sector F0; a second 48 Kbyte sector F1, a third 8 Kbyte sector F2 and a fourth 8 Kbyte sector F3.

A fifth 4 Kbyte sector F4 represents and corresponds to a first EEPROM emulated sector E0, while a sixth 4 Kbyte sector F5 represents and corresponds to a second emulated EEPROM sector E1.

An 8 Kbyte test portion 3 of the Flash memory macrocell 1 is provided to store test flags.

Sense amplifiers circuit portions 4 and 5 are provided at opposite sides of the memory macrocell 1, as shown in FIG. 1.

Those sense amplifiers are connected to a program/erase controller 6 which cooperates with a dedicated registers interface 7 through a RAM buffer 8.

A 256 word ROM 9 is also connected to the controller 6.

Figure 2:
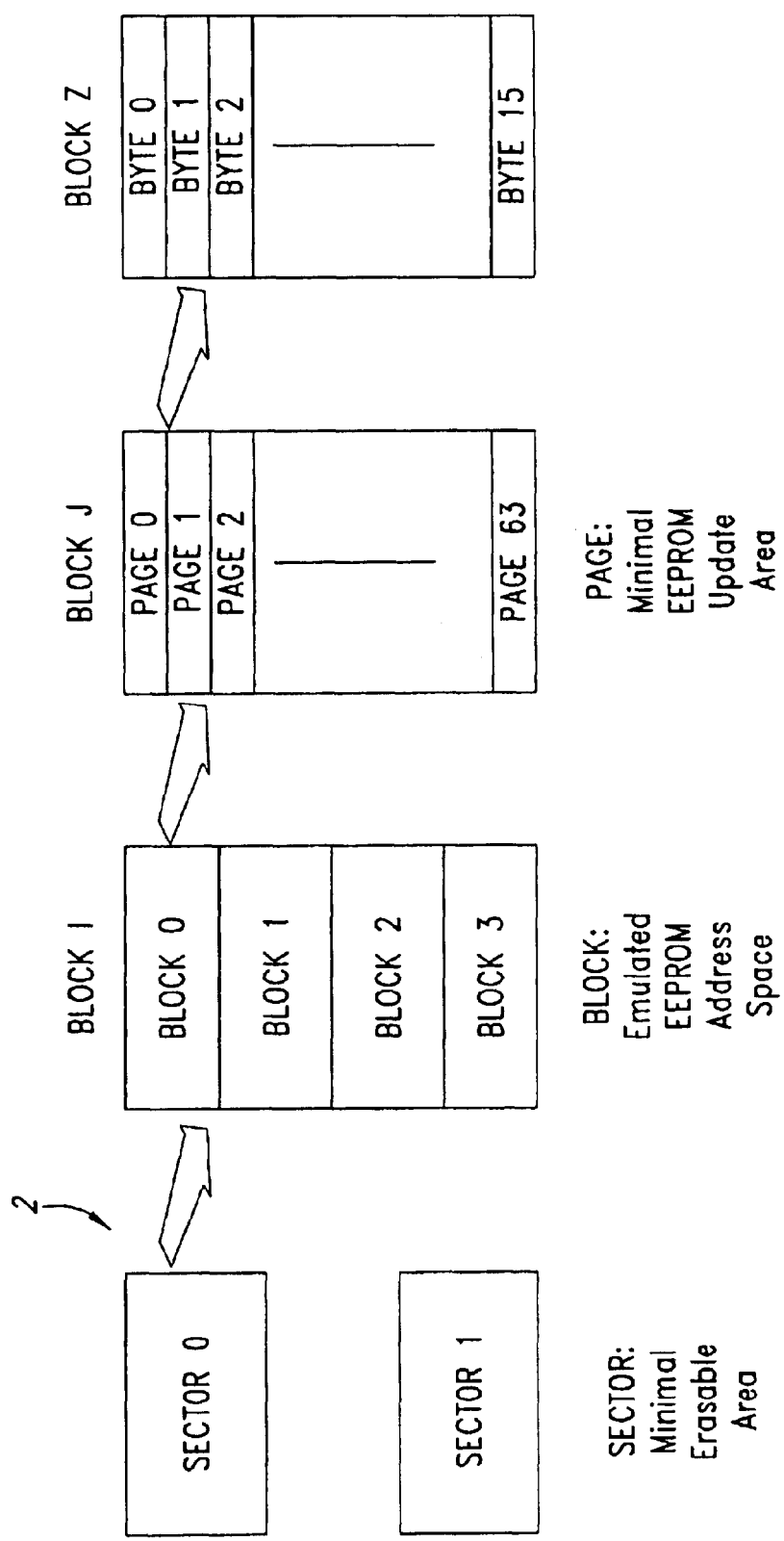
FIG. 2 shows a schematic diagram of the inside structure of the EEPROM emulated memory portion of FIG. 1.

The first and second EEPROM emulated sectors E0, E1 are each divided in four blocks BLOCK 0, . . . , BLOCK3 of the same size. FIG. 2 shows schematically the emulated EEPROM structure.

Each block is divided in up to sixty-four pages and each page is formed by sixteen bytes.

It will be appreciated that the sizes and numbers of the sectors, blocks, pages, and bytes indicated herein are exemplary only and other sizes and numbers could be employed for each of those memory portions without departing from the invention.

At each page update, selected page data are moved to the next free block. When a sector is full, all the pages are swapped to the other sector.

Figure 3:
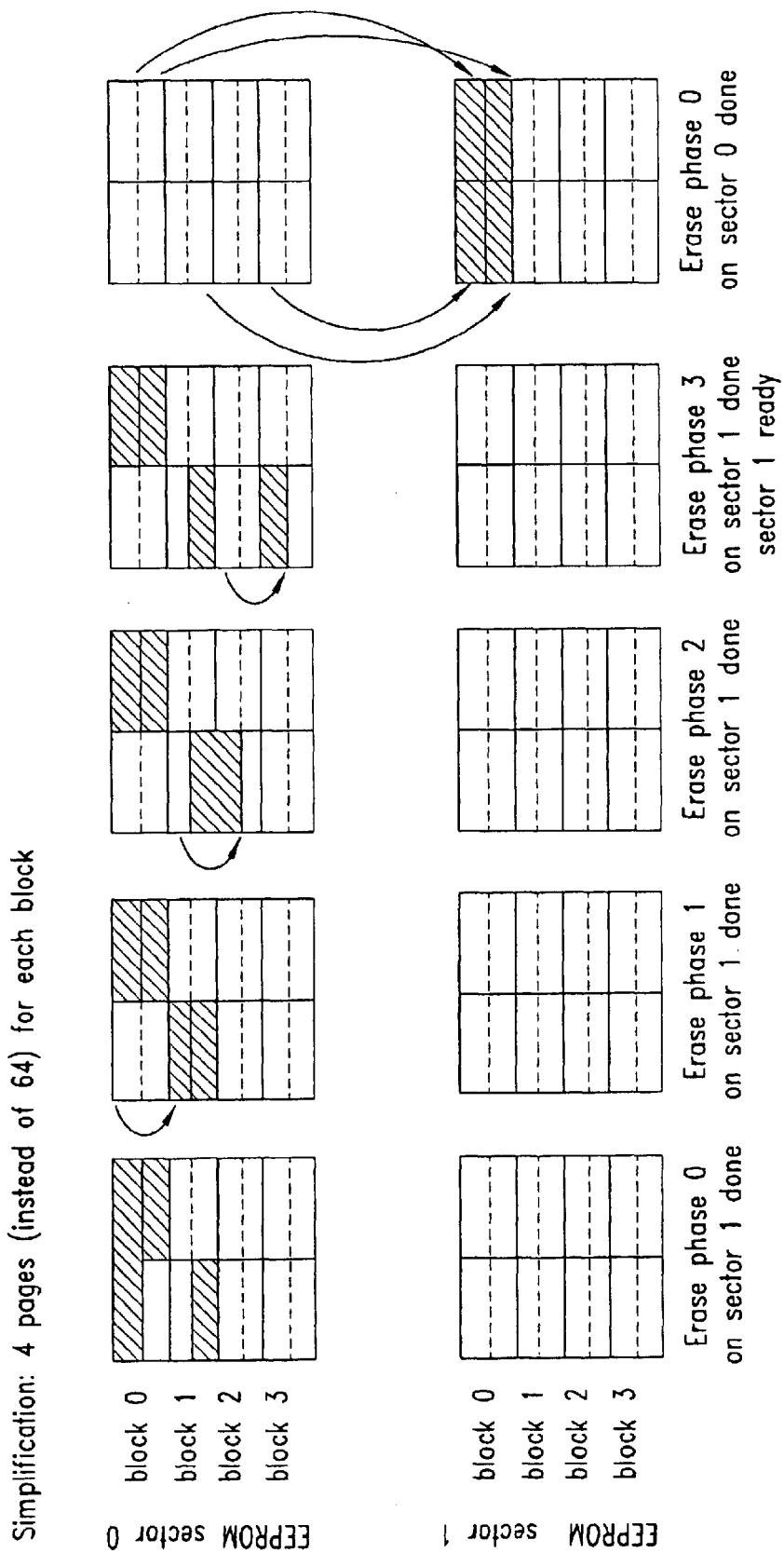
FIG. 3 shows a simplified and schematic view in greater detail of the EEPROM portion structure.

FIG. 3 shows a simplified and schematic view in which each block includes only four pages instead of the sixty-four pages above mentioned. This simplified layout is used just to explain the EEPROM hardware emulation according to the invention.

Figure 5:
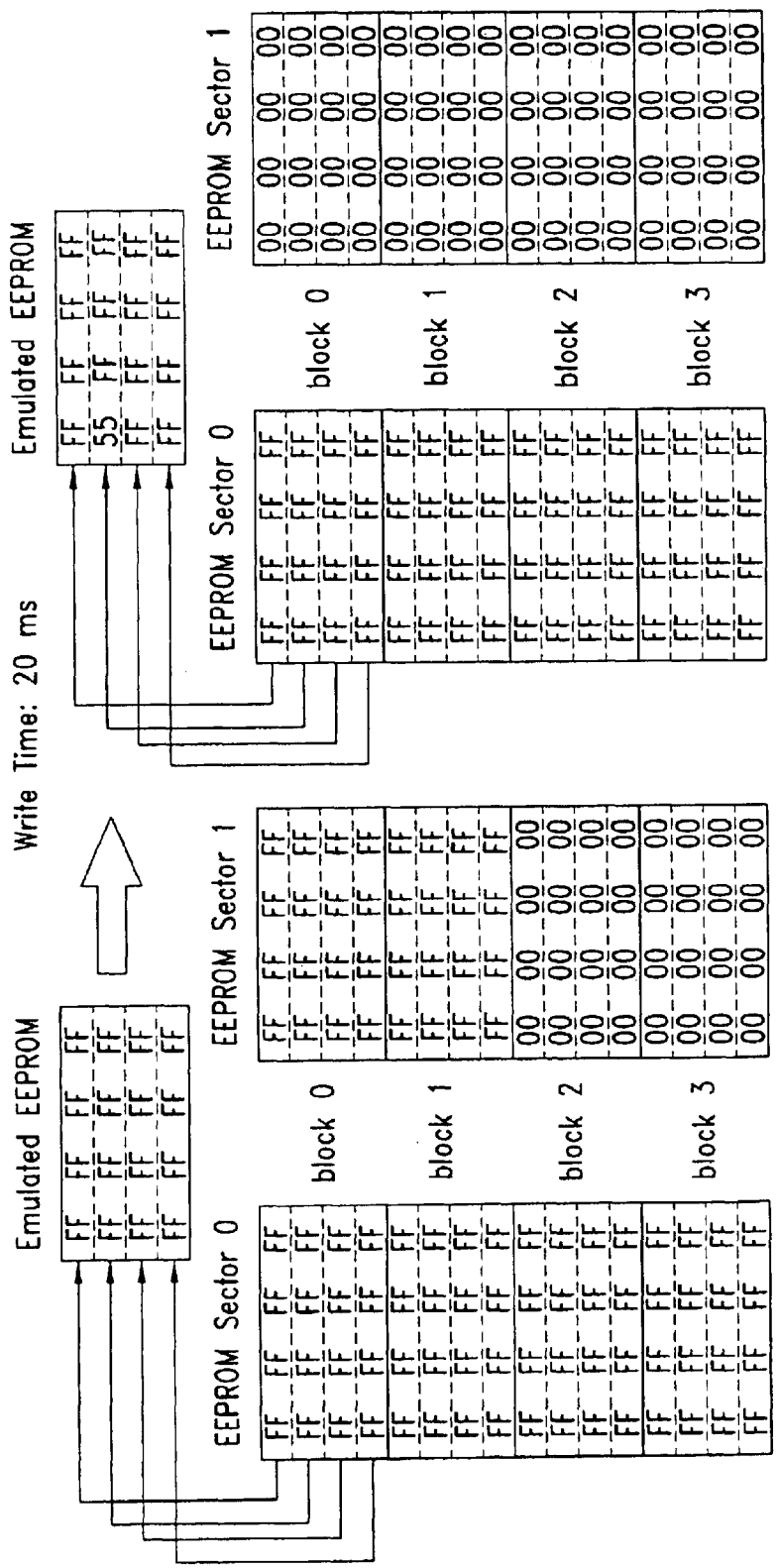
FIGS. 5 to 12 show simplified and schematic views of a series of updating phases concerning the EEPROM sectors of the memory macrocell of FIG. 1.

Now, with specific reference also to the example of FIG. 5, the page updating procedure will be disclosed.

Each page inside each block must be identified to know in which block the updated page is. In this respect, a group of non-volatile pointers is used.

In each EEPROM sector E0, E1 some additional non-volatile memory locations are provided. Those locations are not accessible by the user.

Those locations are 256 bytes for each sector E0, E1 and are more than the amount strictly necessary to store the pointers. Only 66 locations are effectively used; 64 for the page pointers (one for each page) and other two for indicating the updating status of the other sector.

The above memory locations are programmed in the single bit mode (bit by bit); in other words, at each updating step different locations are programmed to "0" since in a Flash memory portion it's not possible to overwrite a memory location without a previous erasing of that location, but this would involve losing also the user's information.

The registers writing strategy must keep in consideration the fact that when a sector is erased even the registers included in that sector are erased too.

Therefore, the content of non-volatile registers is also stored in volatile memory locations to allow an efficient addressing of the EEPROM user's space.

The erasing phase is a time consuming operation for the periods of time which are normally acceptable for writing an EEPROM allocation. That's why the erasing phase is divided into a number of steps corresponding to the number of blocks, which are four in this example.

In this manner the EEPROM sector complementary to the one being updated will be surely erased even in the worst case in which the same page is continuously updated. In other words, after four writing phases a swap on the other sector is required.

The specific erasing phase is divided in four steps providing respectively:

a pre-programming phase to "0" of half a sector;

a subsequent pre-programming to "0" of the other half sector;

erasing plus erasing verify on a sample of cells;

full erasing.

Moreover, since the EEPROM updating phase may require a certain number of steps, a one bit flag is set when the updating phase is started and a different one bit flag is set when the updating phase is completed. This facilitates the recovery operation in case of a fault during updating.

In the example of FIG. 5, the EEPROM sector 0 initially is fully erased (initial content is FFh) and error phase 0, the first pre-programming phase, has been completed to set the bits of the second half (blocks 2 and 3) of the EEPROM sector 1 to zero. Upon receiving an instruction to write 55h into the first location of page 1, the program/erase controller 6 writes the 55h into the first location of page 1 of block 1 rather than the corresponding location of block 0. In addition, the controller 6 performs error phase 1, the second pre-programming phase, to set the bits of the first half (blocks 0 and 1) of the EEPROM sector 1 to zero.

Figure 6:
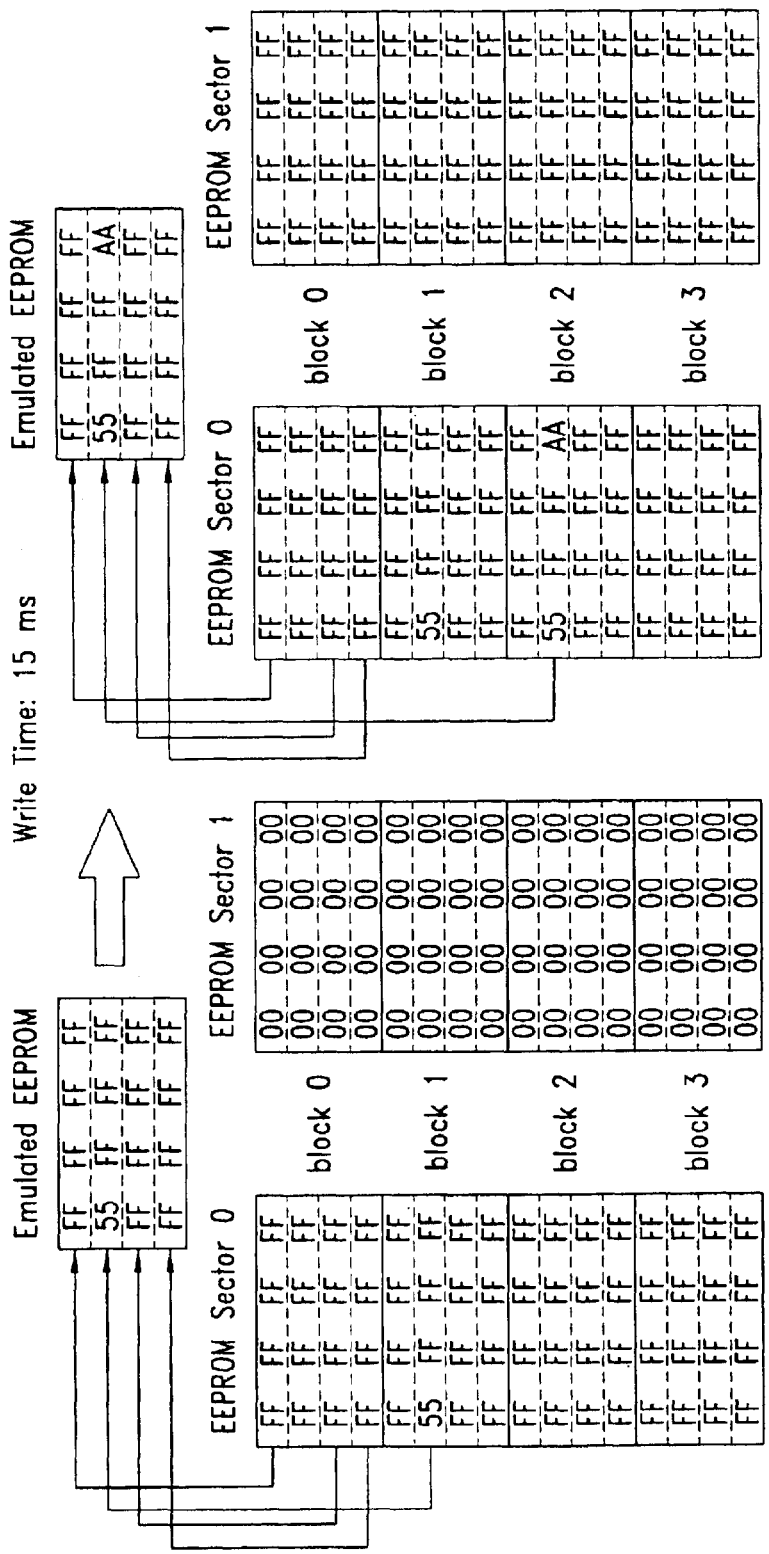

In FIG. 6, an AAh is being written into the last location of page 1. Rather that writing it into the block 1, the program/erase controller 6 writes the AAh into page 1 of block 2 and the 55h previously written into page 1 of block 1 is moved into page 1 of block 2. In addition, the controller 6 performs error phase 2 to erase and erase verify a sample of cells of EEPROM sector 1 (FIG. 6 shows all cells being erased because of the simplified example using pages of 4 bytes instead of 16).

Figure 7:
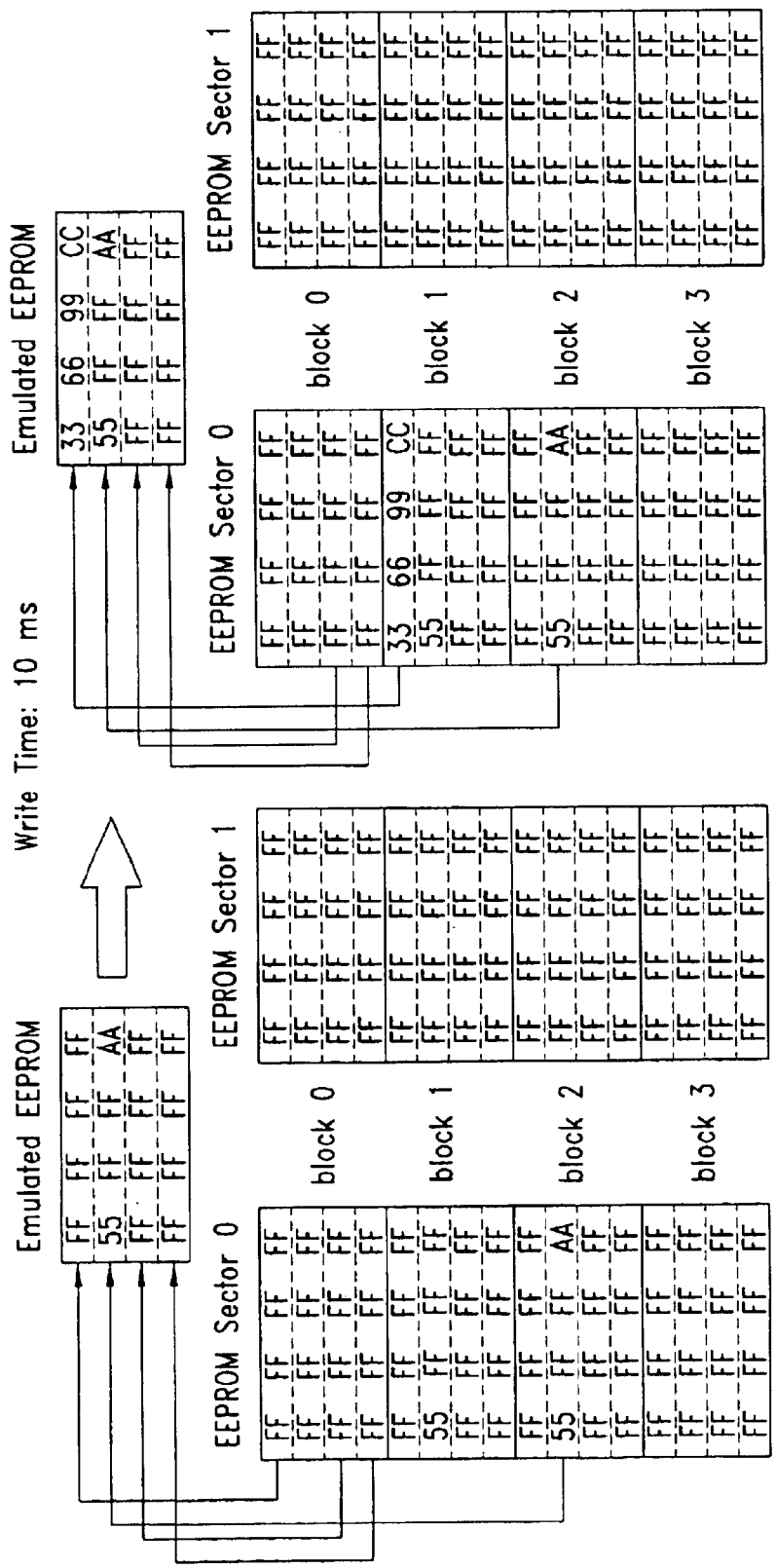

In FIG. 7, the program/erase controller 6 writes 33h, 66h, 99h, and CCh into page 0. Since in the example no data has already been written into page 0, the controller 6 writes the 4 data bytes into page 0 of block 1. In addition, the controller 6 performs error phase 3 to erase all of the bytes of EEPROM sector 1.

Figure 8:
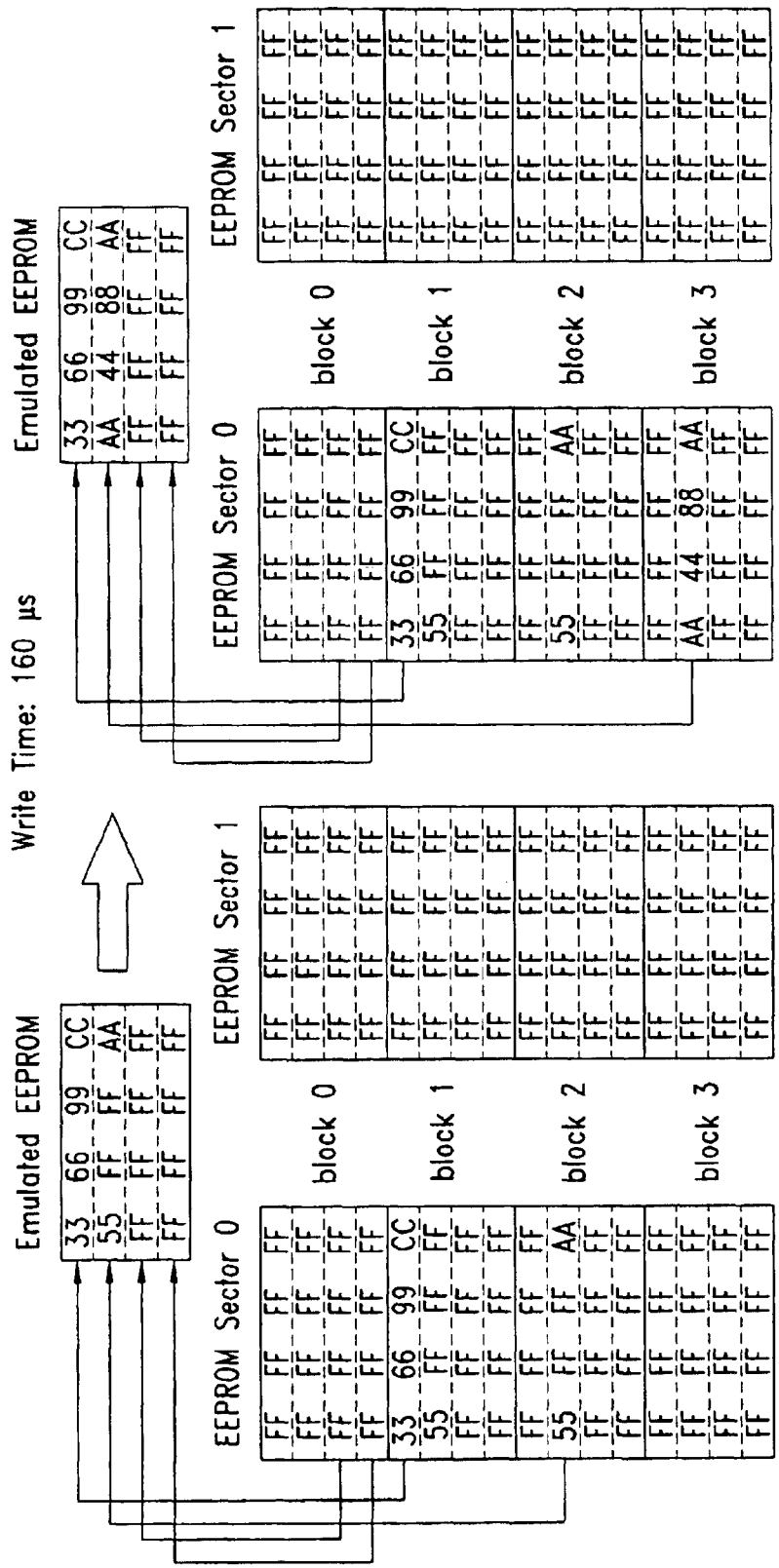

In FIG. 8, AAh, 44h, and 88h are written into the first 3 locations of page 1. The new data are written into page 1 of block 3 and the unchanged AAh in the fourth location of page 1 is moved from block 2 to block 3. No erase is performed on EEPROM sector 1 because it is already fully erased.

Figure 9:
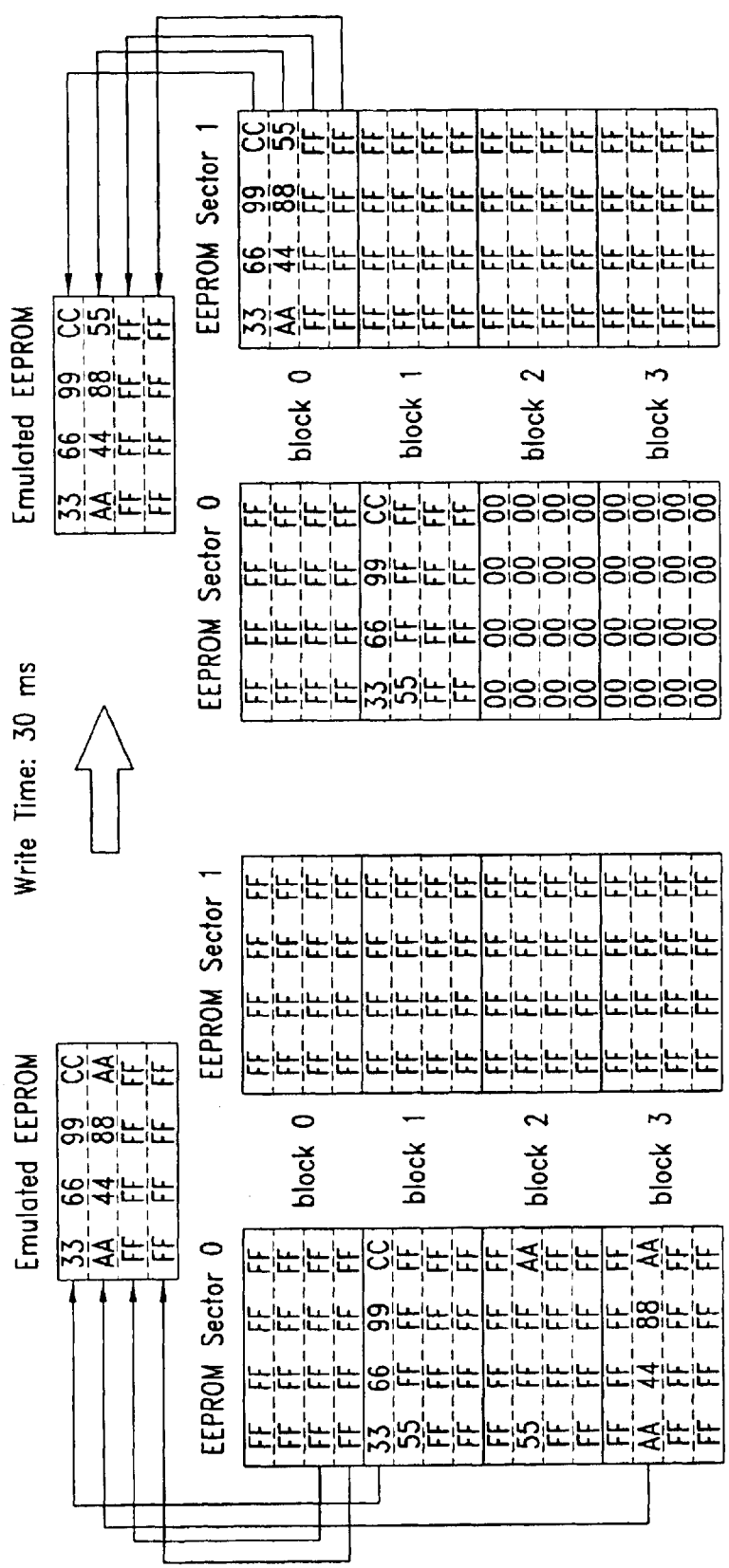
Figure 10:
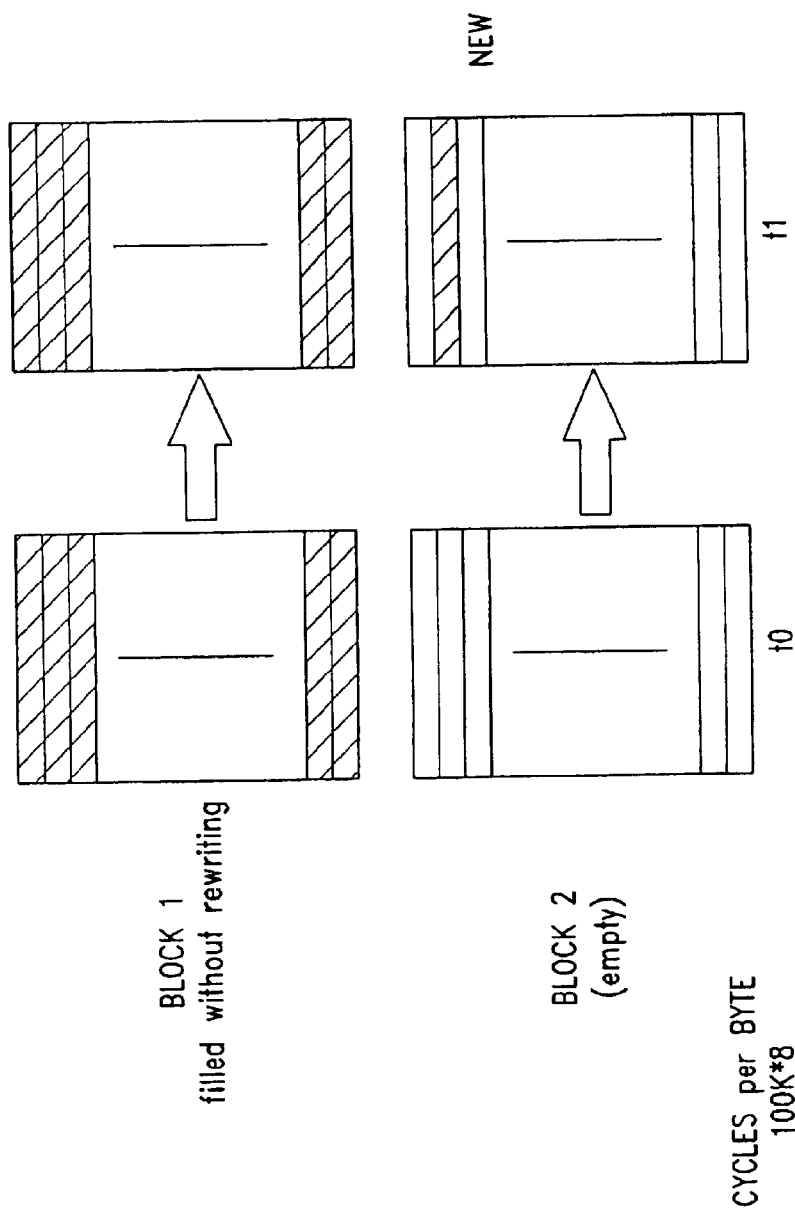
Figure 11:
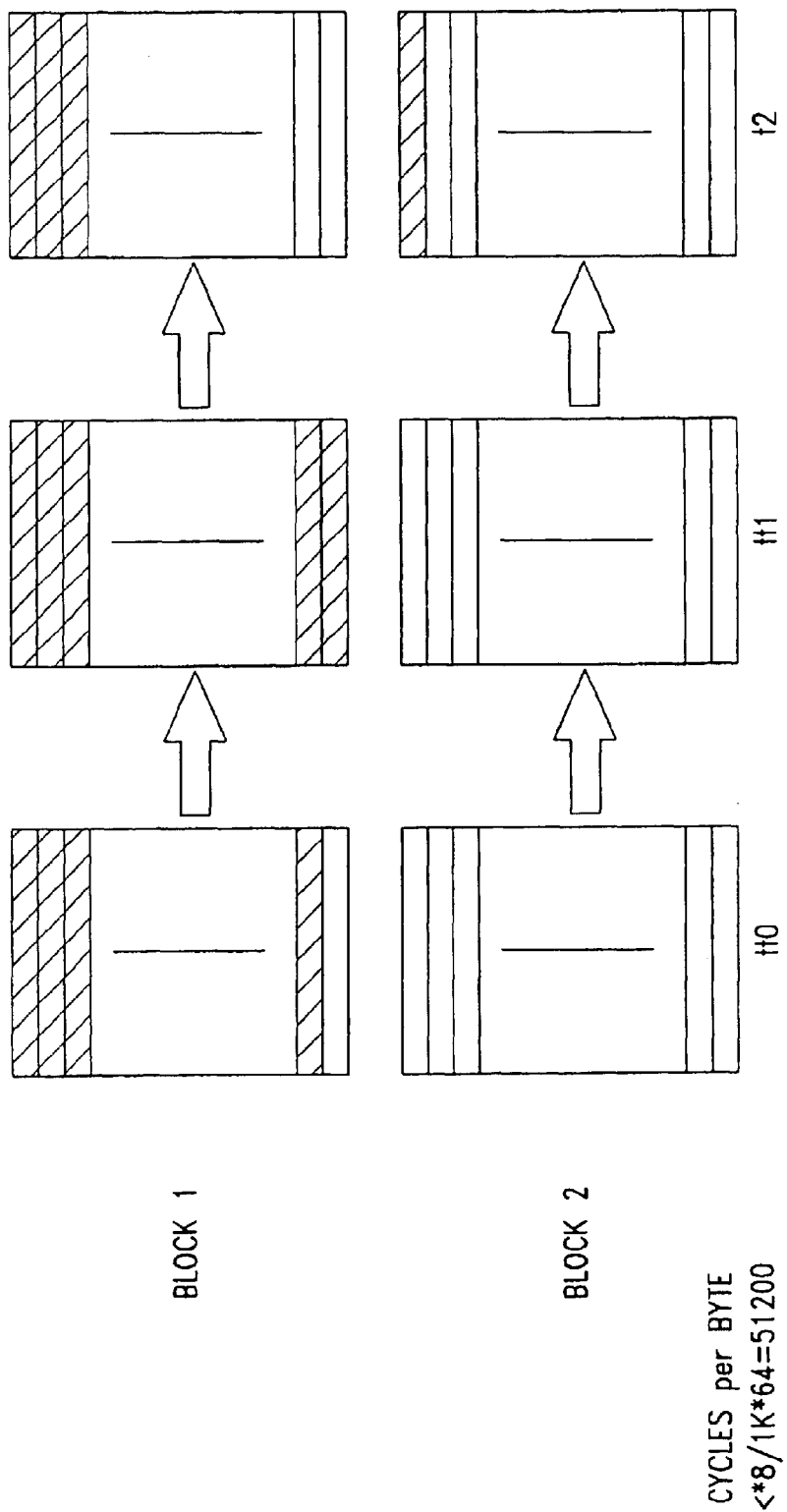
Figure 12:
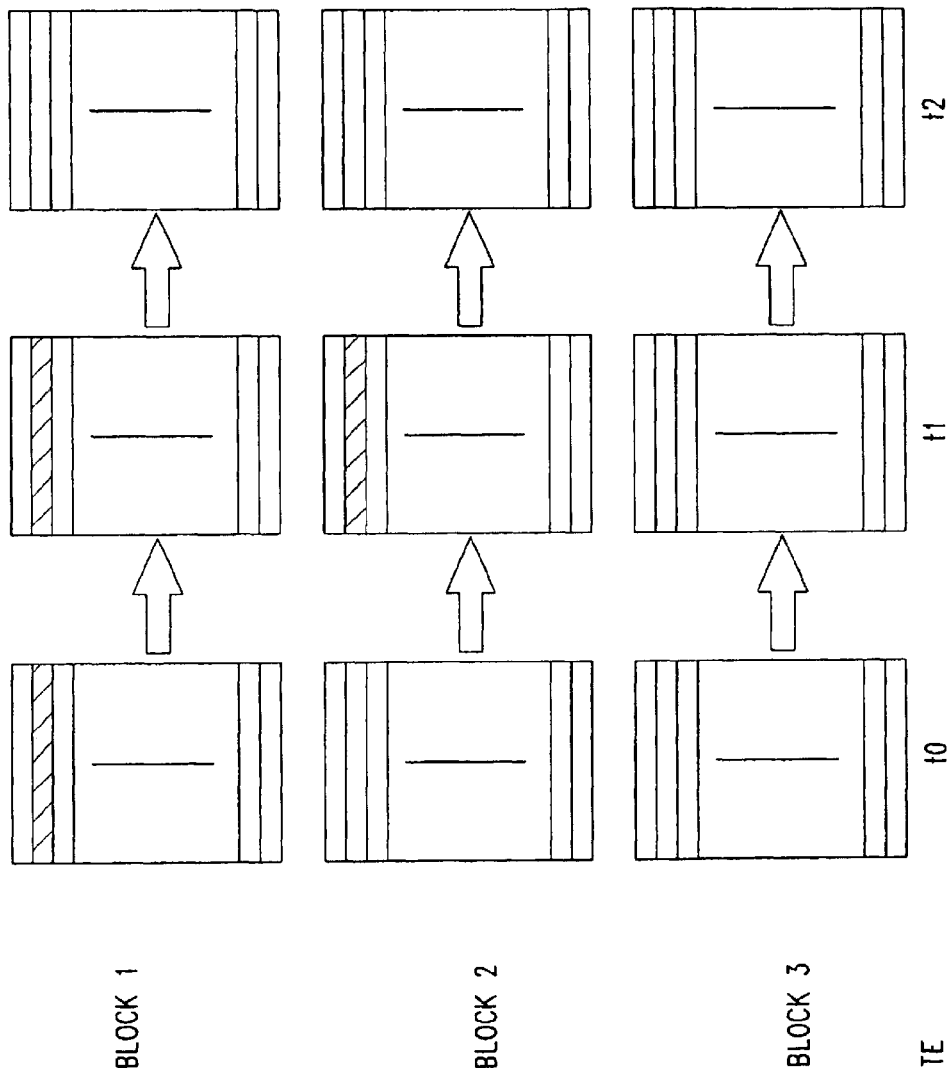
Figure 13:
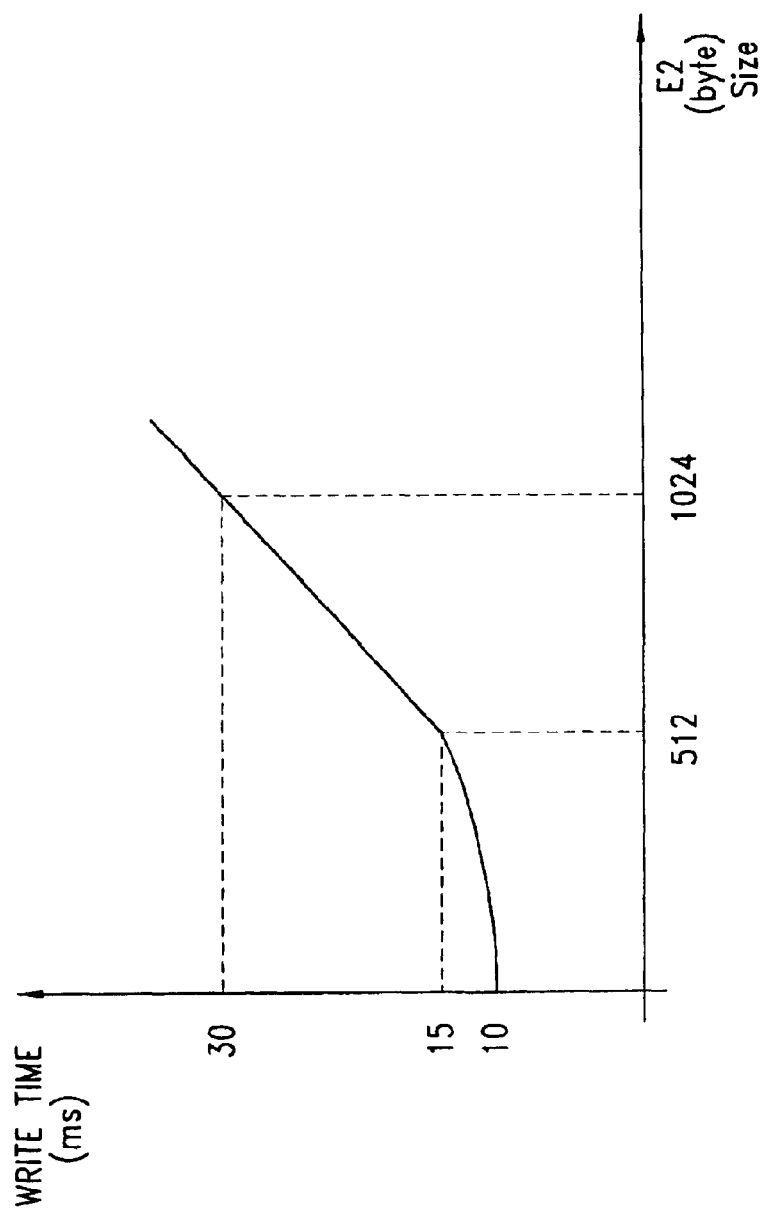
FIG. 13 is a diagram of the write time versus the memory size for the memory macrocell of FIG. 1.

In FIG. 9, 55h is being written into the last location of page 1. The program/erase controller 6 writes the 55h into last location of page 1 of block 0 of EEPROM sector 1 and moves all of the data from EEPROM sector 0 to block 0 of EEPROM sector 1. In addition, the controller 6 performs error phase 0 on EEPROM sector 0 by setting to zero the bytes of blocks 2 and 3 of EEPROM sector 0.

Figure 14:
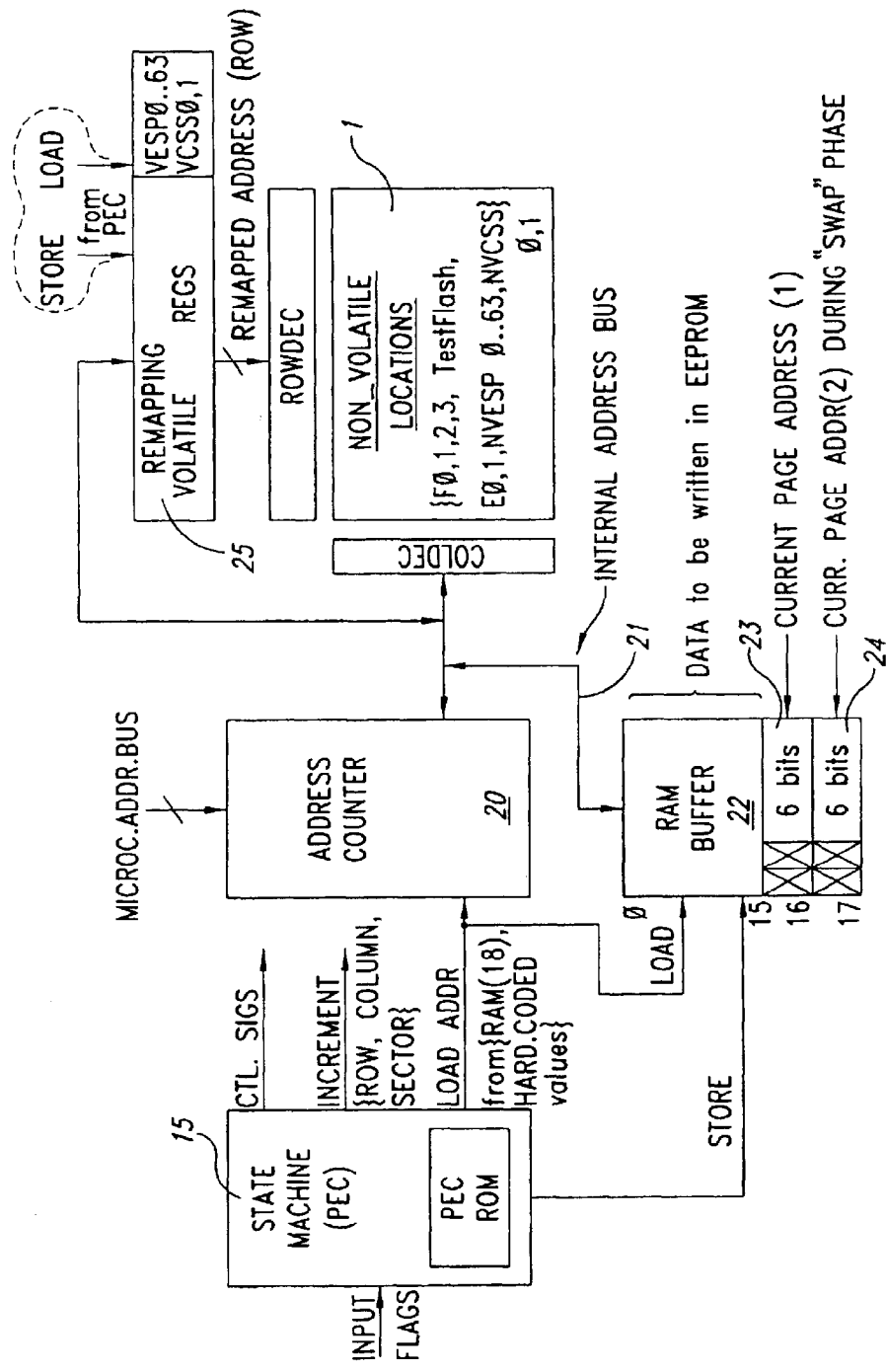
FIG. 14 shows a simplified and schematic view of a state machine controlling an address counter inside the memory macrocell of FIG. 1.

Let's now consider the example of FIG. 14 showing a state machine 15 (PEC) controlling an address counter 20 which receives as input control signals CTL_SIGN, INCREMENT coming from the state machine 1S.

The address counter 20 is output connected to an internal address bus 21 which is inside the memory macrocell 1.

The address counter 20 doesn't correspond to the usual address counter included into a Flash memory since it receives also control signals from the state machine 15 in order to control the loading of hard-coded addresses in volatile or non-volatile registers 25. The registers 25 may be read and updated by the microcontroller during a reset phase or by the state machine 15 after an EEPROM update.

The address bus 21 is connected to the input of a 16 byte RAM buffer 22 which is used for the page updating of the EEPROM. This RAM buffer 22 includes also two additional bytes 23, 24 to store the page address during the page updating phase and the swap step.

When the user's program requires to write one or more byte in the EEPROM memory portion, the RAM buffer 22 is charged. Each charged memory location of the RAM buffer 22 has a supplementary bit TOBEPROG which is set so that the state machine 15 is able to complete the charging phase with "old" data in non-flagged locations by just checking the content of the TOBEPROG bit during a sub-routine "Page Buffer Filling" as will be later explained.

The state machine 15 is active for instance in controlling the EEPROM pace updating phase through an algorithm which will be disclosed in detail hereinafter.

Flash and EEPROM memory operations are controlled through the register interface 7 mapped in memory, see for instance the segment 22h in FIG. 3A.

Flash Write Operations allows one to program (from 1 to 0) one or more bytes or erase (from 0 or 1 to 1) one or more sectors.

EEPROM Write Operations allows to program (from 0 or 1 to 0 or 1) one or more bytes or erase all the memory (from 0 or 1 to 1).

Set Protection Operations allows to set Access, Write or Test Mode Protections.

As previously disclosed, the memory 1 comprises three portions: four main Flash sectors F0, F1, F2 and F3 for code, a small OTP zone included into the Flash and an EEPROM portion 2. FIG. 3B reports in a table form the addresses and size of each memory sector.

The last four bytes of the OTP area (211FFCh to 211FFFh) are reserved for the Non-Volatile Protection Registers and cannot be used as storage area.

The Flash memory portion, including the OTP, and the EEPROM have duplicate sense amplifiers 4, 5, so that one can be read while the other is written. However, simultaneous Flash and EEPROM write operations are forbidden.

Both Flash and EEPROM memories can be fetches. Reading operands from Flash or EEPROM memories is achieved simply by using whatever microcontroller addressing mode with the Flash and in the EEPROM memory as source.

Writing in the Flash and in the EEPROM memories are controlled through the register interface 7 as explained hereinafter.

The memory macrocell 1 has a register interface 7 mapped in the memory space indicated with the segment 22h (FIG. 3A). All the operations are enabled through two control registers; A FCR (Flash Control Register) for the Flash (and OTP) operations and an ECR (EEPROM Control Register) for the EEPROM operations. Those registers are shown in FIGS. 3C and 3D respectively, The status of a write operation inside the Flash memory can be monitored through a dedicated status register: FSR (Flash Status Register) shown in FIG. 3E.

1) Flash Memory Operations

Four Write Operations are available for the Flash memory portion: Byte program, Page Program, Sector Erase and Chip Erase. Each operation is activated by a sequence of three instructions:

| OR | FCR, | #OPMASK | ; Operation selection |
| LD | ADD, | #DATA | ; Address and Data load |
| OR | FCR, | #080h | ; Operation start |

The first instruction is used to select the desired operation, by setting bits FBYTE, FPAGE, FSECT or FCHIP of FCR. The second instruction is used to choose the address to be modified and the data to be programmed. The third instruction is used to start the operation (set of bit FWMS of FCR).

FWMS bit and the Operation Selection bit of FCR are automatically reset at the end of the Write operation.

Once selected, but non yet started (FWMS bit still reset), one operation can be canceled by resetting the Operation Selection bit. The eventually latched addresses and data will be reset.

In the following, when non differently specified, let's suppose than the Data Pace Pointer DPR0 has been set to point to the desired 16 Kbyte block to modify, while DPR1 has been set to point to the Register interface:

| SPP | #21 | | ; MMU paged registers |
| LD | R241, | #089h | ; Register Interface |
| LD | R240, | #000h | ; 1st 16K page of Flash 0 |
| LD | R240, | #001h | ; 2nd 16K page of Flash 0 |
| LD | R240, | #002h | ; 3rd 16K page of Flash 0 |
| LD | R240, | #003h | ; 4th 16K page of Flash 0 |
| LD | R240, | #004h | ; 1st 16K page of Flash 1 |
| LD | R240, | #005h | ; 2nd 16K page of Flash 1 |
| LD | R240, | #006h | ; 3rd 16K page of Flash 1 |
| LD | R240, | #007h | ; Flash 2 and Flash 3 |
| LD | R240, | #084h | ; OTP |

A) Byte Program

The Byte program operation allows to program 0s in place of 1s.

| | | | |
|---|---|---|---|
| OR | 0400h, | #010h | ; Set FBYTE in FCR |
| LD | 03CA7h, | #D6h | ; Address and Data load |
| OR | 0400h, | #080h | ; Set FWMS in FCR |

The first instruction is used to select the Byte Program operation, by setting bit FBYTE of FCR. The second instruction is used to specify the address and the data for the byte programming. The third instruction is used to start the operation (set of bit FWMS of FCR).

If more than one pair of address and data are given, only the last pair is taken into account. It's not necessary to use a word-wide instruction (like LDW) to enter address and data: only one byte will be programmed, but it is unpredictable whether it will be the low or the high part of the word (it depends on the addressing mode chosen).

After the second instruction the FBUSY bit of FCR is automatically set. FWMS, FBYTE and FBUSY bits of FCR are automatically reset at the end of the Byte program operation (10 µs typical).

The Byte Program operation is allowed during a Sector Erase Suspend, and of course not in a sector under erase.

B) Page Program

The Page Program operation allows to program 0s in place of 1s. From 1 to 16 bytes can be stored in the internal Ram before starting the execution.

| | | | |
|---|---|---|---|
| OR | 0400h, | #040h | ; Set FPAGE in FCR |
| LD | 028B0h, | #0F0h | ; 1st Address and Data |
| LD | 028B1h, | #0E1h | ; 2nd Add and Data (Opt.) |
| LD | 028B2h, | #0D2h | ; 3rd Add and Data (Opt.) |
| . | . | | |
| . | . | | |
| . | . | | |
| LD | 028Bxh, | #0xxh | ; xth Add and Data (Opt.) |
| . | . | | |
| . | . | | |
| . | . | | |
| LD | 028beh, | #01Eh | ; 15th Add and Data (Opt.) |
| LD | 028bfh, | #00Fh | ; 16th Add and Data (Opt.) |
| OR | 0400h, | #080h | ; Set FWMS in FCR |

The first instruction is used to select the Page Program operation, by setting bit FPAGE of FCR. The second instruction is used to specify the first address and the firs data to be programmed. This second instruction can be optionally followed by up to 15 instructions of the same kind, setting other addresses and data to be programmed. All the addresses must belong to the same page (only the four LSBs of address can change). Data contained in page addresses that are not entered are left unchanged. The third instruction is used to start the operation (set of bit FWMS of FCR).

If one address is entered more than once inside the same loading sequence, only the last entered data is taken into account. It is allowed to use word-wide instructions (like LDW) to enter address and data.

After the second instruction the FBUSY bit of FCR is automatically set. FWMS, FPAGE and FBUSY bits of FCR are automatically reset at the end of the Page Program operation (160 us typical).

The Page Program operation is not allowed during a Sector Erase Suspend.

C) Sector Erase

The Sector Erase operation allows to erase all the Flash locations to 0ffh. From 1 to 4 sectors to be simultaneously erased can be entered before to start the execution. This operation is not allowed on the OTP area It is not necessary to pre-program the sectors to 00h, because this is done automatically.

| | | | |
|---|---|---|---|
| PP | #21 | | ; MMU paged registers |
| LD | R240, | #000h | ; 1st 16K page of Flash 1 |
| LD | R242, | #004h | ; 1st 16K page of Flash 2 |
| LD | R243, | #007h | ; Flash 2 and Flash 3 |

First DPR0 is set to point somewhere inside the Flash sector 0, DPR2 inside Flash sector 1, DPR3 inside Flash sectors 2 and 3. DPR1 continues to point to the Register interface.

| | | | |
|---|---|---|---|
| OR | 04000h, | 008h | ; Set FSECT in FCR |
| LD | 00000h, | 000h | ; Flash 0 selected |
| LD | 08000h, | 000h | ; Flash 1 selected (Opt. 9) |
| LD | 0C000h, | 000h | ; Flash 2 selected (Opt. 9) |
| LD | 0E000h, | 000h | ; Flash 3 selected (Opt. 9) |
| OR | 04000h, | 080h | ; Set FWMS in FCR |

The first instruction is used to select the Sector Erase operation, by setting bit FSECT of FCR. The second instruction is used to specify an address belonging to the first sector to be erased. The specified data is "don't care." This second instruction can be optionally followed by up to three instructions of the same kind, selecting other sectors to be simultaneously erased. The third instruction is used to start the operation (set of bit FWMS of FCR).

Once selected, one sector cannot be deselected. The only way to deselect the sector, is to cancel the operation, by resetting bit FSECT. It is allowed to use word-wide instructions (like LDW) to select the sectors.

After the second instruction the FBUSY bit of FCR is automatically set. FWMS, FSECT and FBUSY bits of FCR are automatically reset at the end of the Sector Erase operation (1.5 s typical).

The Sector Erase operation can be suspended in order to read or to program data in a sector not under erase. The Sector Erase operation is not allowed during a Sector Erase Suspend.

C.1) Sector Erase Suspend/Resume

The Sector Erase Suspend is achieved through a single instruction.

| | | | |
|---|---|---|---|
| OR | 0400h, | #004h | ; Set FSUSP in FCR |

This instruction is used to suspend the Sector Erase operation, by setting bit FSUSP of FCR. The Erase Suspend operation resets the Flash memory to normal read mode (automatically resetting bits FWMS and FBUSY) in a maximum time of 15 µs. Bit FSECT of FCR must be kept set during the Sector Erase Suspend phase: if it is software reset, the Sector Erase operation is cancelled and the content of the sectors under erase is not guaranteed.

When in Sector Erase Suspend the memory accepts only the following operations: Read, Sector Erase Resume and Byte program. Updating the EEPROM memory is not possible during a Flash Sector Erase Suspend.

The Sector Erase operation can be resumed through two instructions:

```
AND   04000h,   #0FBh   ; Reset FSUSP in FCR
OR    04000h,   #080h   ; Set FWMS in FCR
```

The first instruction is used to end the Sector Erase Suspend phase, by resetting bit FSUSP of FCR. The second instruction is used to restart the suspended operation (set of bit FWMS of FCR). After this second instruction the FBUSY bit of FCR automatically set again.

D) Chip Erase

The Chip Erase operation allows to erase all the Flash locations to 0ffh. This operation is simultaneously applied to all the 4 Flash sectors (OTP area excluded). It is not necessary to pre-program the sectors to 00h, because this is done automatically.

```
OR    04000h,   #020h   ; Set FCHIP in FCR
OR    04000h    #080h   ; Set FWMS in FCR
```

The first instruction is used to select the Chip Erase operation, by setting bit FCHIP of FCR. The second instruction is used to start the operation (setting of bit FWMS of FCR).

It is not allowed to set the two bits (FCHIP and FWMS) with the same instruction.

After the second instruction the FBUSY bit of FCR is automatically set. FWMS, FCHIP and FBUSY bits of FCR are automatically reset at the end of the Chip Erase operation (3 s typical).

The Chip Erase operation cannot be suspended. The Chip Erase operation is not allowed during a Sector Erase Suspend.

2) EEPROM Memory Operations

Two Write Operations are available for the EEPROM memory: Page Update and Chip Erase. Each operation is activated by a sequence of three instructions:

```
OR    ECR,    #OPMASK   ; Operation selection
LD    ADD,    #DATA     ; Address and Data load
OR    ECR,    #080h     ; Operation start
```

The first instruction is used to select the desired operation, by setting bits EPAGE or ECHIP of ECR. The second instruction is used to choose the address to be modified and the data to be programmed. The third instruction is used to start the operation (set of bit EWMS of ECR).

EWMS bit and the Operation Selection bit of ECR are automatically reset at the end of the Write operation.

Once selected, but not yet started (EWMS bit still reset), one operation can be canceled by resetting the Operation Selection bit. The eventually latched addresses and data will be reset.

In the following, when not differently specified, let's suppose that the Data Page Pointer DPR0 has been set to point to the EEPROM to modify, while DPR1 has been set to point to the Register interface:

```
SPP   #21                   ; MMU paged registers
LD    R241,   #089h         ; Register Interface
LD    R240,   #088h         ; EEPROM
```

Figure 4:
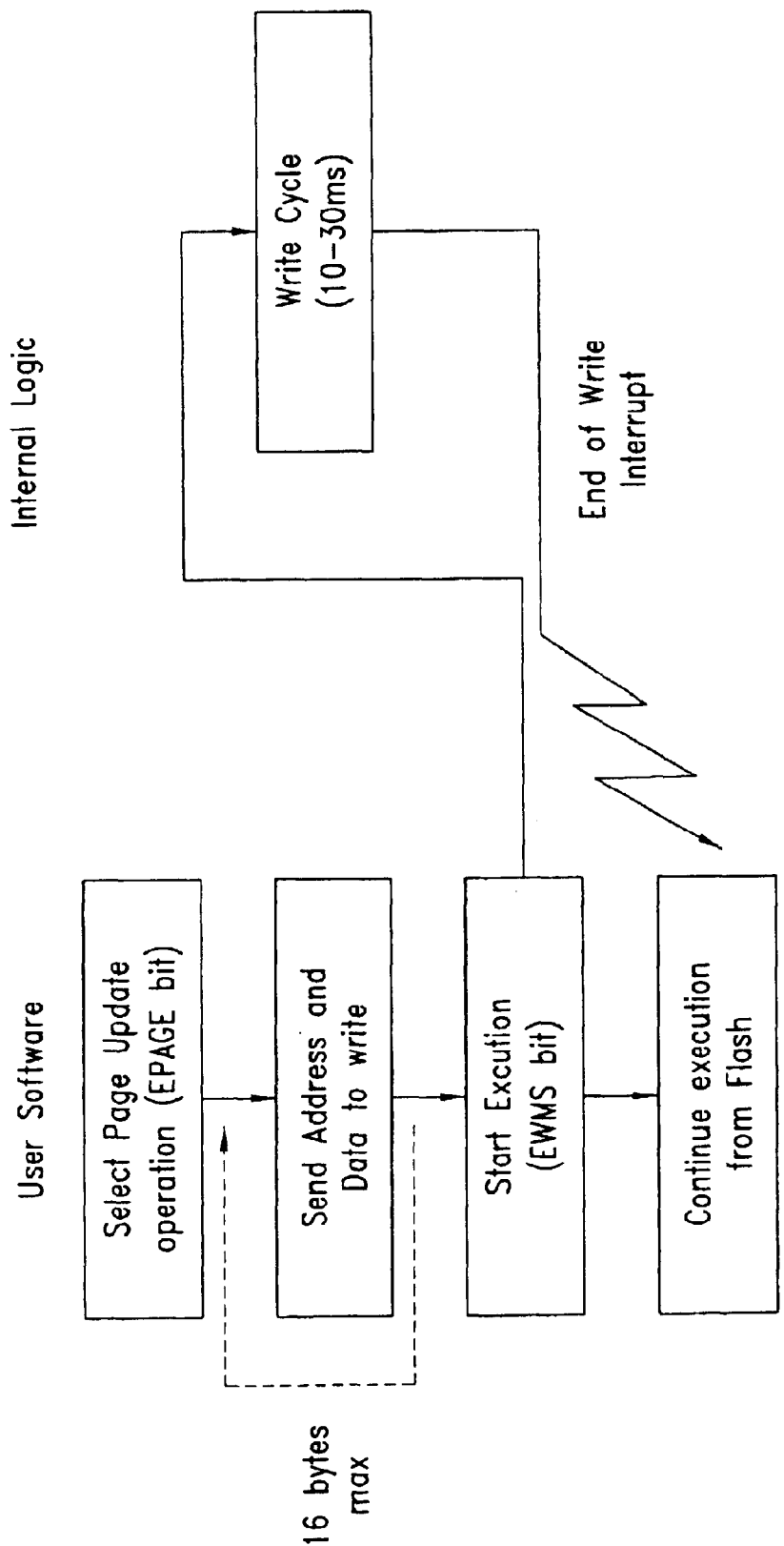
FIG. 4 is a high level flow-chart representing the steps of a method in accordance with an embodiment of the present invention.

It's important to note that the EEPROM operations duration are related to the EEPROM size, as shown in the table of FIG. 4B.

A) Page Update

The page Update operation allows to write a new content. Both 0s in place of 1s and 1s in place of 0s. From 1 to 16 bytes can be stored in the internal Ram buffer before to start the execution.

```
OR    04001h,   #040h   ; Set EPAGE in ECR
LD    001C0g,   #0F0h   ; 1st Address and Data
LD    001C1h,   #0E1h   ; 2nd Add and Data (opt.)
LD    001C2h,   #0D2h   ; 3rd Add and Data (opt.)
.     .
.     .
.     .
LD    001Cxh,   #0xxh   ; xth Add and Data (opt.)
.     .
.     .
.     .
LD    001ceh,   #01Eh   ; 15th Add and Data (opt.)
LD    001cfh,   #00Fh   ; 16th Add and Data (opt.)
OR    04001h,   #080h   ; Set EWMS in ECR
```

The first instruction is used to select the Page Update Operation, by setting bit EPAGE of EVR. The second instruction is used to specify the first address and the first data to be modified. This second instruction can be optionally followed by up to 15 instructions of the same kind, setting other addresses and data to be modified. All the addresses must belong to the same page (only the four LSBs of address can change). Data contained in page addresses that are not entered are left unchanged. The third instruction is used to start the operation (setting of bit EWMS of ECR).

If one address is entered more than once inside the same loading sequence, only the last entered data is taken into account. It is allowed to use word-wide instructions (like LDW) to enter address and data.

After the second instruction the EBUSY bit of ECR is automatically set. EWMS, EPAGE and EBUSY bits of ECR are automatically reset at the end of the Page Update operation (30 ms typical).

The Page Update operation is not allowed during a Flash Sector Erase Suspend.

B) Chip Erase

The Chip Erase operation allows to erase all the EEPROM locations to 0ffh.

```
OR    04001h,   #020h   ; Set ECHIP in ECR
OR    04001h,   #080h   ; Set EWMS in ECR
```

The first instruction is used to select the Chip Erase operation, by setting bit ECHIP of ECR. The second instruction is used to start the operation (setting of bit EWMS of ECR).

It is not allowed to set the two bits (ECHIP and EWMS) with the same instruction.

After the second instruction the EBUSY bit of ECR is automatically set. EWMS, ECHIP and EBUSLY bits of ECR are automatically reset at the end of the Chip Erase operation (70 ms typical).

The Chip Erase operation cannot be suspended. The Chip Erase operation is not allowed during a Flash Sector Erase Suspend.

3) Protections Operations

Only one Write Operation is available for the Non Volatile Protection Registers: Set Protection operation allows to program 0s in place of 1s. From 1 to 4 bytes can be stored in the internal Ram buffer before to start the execution. This operation is activated by a sequence of 3 instructions:

| OR | FCR, | #002h | ; Operation selection |
| LD | ADD, | #DATA | ; Address and Data load |
| OR | FCR, | #080h | ; Operation start |

The first instruction is used to select the Set protection operation, by settling bit PROT of FCR. The second instruction is used to specify the first address and the first data to be programmed. This second instruction can be optionally followed by up to three interactions of the same kind, setting other addresses and data to be programmed. All the addresses must belong to the Non Volatile Protection registers (only the two LSBs of address can change). Protection Registers contained in addresses that are not entered are left unchanged. Content of not selected bits inside selected addresses are left unchanged, too. The third instruction is used to start the operation (setting of bit FWMS of FCR).

If one address is entered more than once inside the same loading sequence, only the last entered data is taken into account. It is allowed to use word-wide instructions (like LDW) to enter address and data.

After the second instruction the FBUSY bit of FCR is automatically set. FWMS, PROT and FBUSY bits of FCR are automatically reset at the end of the Set protection operation (40 µs typical).

Once selected, but not yet started (FWMS bit still reset), the operation can be canceled by resetting PROT bit. The eventually latched addresses and data win be reset.

The Set Protection operation is not allowed during a Sector Erase Suspend.

In the following, when not differently specified, let's suppose that the Data Page pointer DPR0 has been set so to point to the OTP area to modify, while DPR1 has been set so to point to the Register interface:

| SPP | #21 | | ; MMU paged registers |
| LD | R241, | #089h | ; Register Interface |
| LD | R240, | #084h | ; OTP |

There are three kinds of protections: access protection, write protections and test modes disabling.

3.1) Non-Volatile Registers

The protection bits are stored in the last four locations of the OTP area (from 211FFCh to 211FFFh), as shown in FIG. 4A. All the available protections are forced active during reset, then in the initialization phase they are read from the OTP area.

The four non-volatile registers used to store the protection bits for the different protection features are one time programmable (OTP).

The access to these registers is controlled by the protections related to the OTP area where they are mapped.

3.2) Set Access Protections

The Access Protections are given by bits APRA, APRO, APBR, APEE, APEX of NVAPR.

| OR | 04000h, | #002h | ; Set PROT in FCR |
| LD | 01FFCh, | #0F1h | ; Prog WPRS3-1 in NVWPR |
| OR | 04000h, | #080h | ; Set FWMS in FCR |

The first instruction is used to select the Set Protection operation, by setting bit PROt of FCR. The second instruction is used to specify the NVAPR address and the new protection content to be programmed. The third instruction is used to start the operation (setting of bit FWMS of FCR).

3.3) Set Write Protections

The Write Protections are given by bits WPBR, WPEE, WPRS3-0 of NVWPR.

| OR | 04000h, | #002h | ; Set Prot in FCR |
| LD | 01FFDh, | #0F1h | ; Prog WPRS3-1 in NVWPR |
| OR | 04000h, | #080h | ; Set FWMS in FCR |

The first instruction is used to select the Set Protection operation, by setting bit PROT of FCR. The second instruction is used to specify the NVWPR address and the new protection content to be programmed. The third instruction is used to start the operation (setting of bit FWMS of FCR).

The Write Protections can be temporary disabled by executing the Set Protection operation and writing 1 into these bits.

| OR | 01000h, #002h | | ; Set Prot in FCR |
| LD | 01FFDh, | #0F2h | ; Prog WPRS0 in NVWPR |
| | | | ; Temp Unprotected WPRS 1 |
| OR | 01000h, #080h | | ; Set FWMS in FCR |

The non-volatile content of the temporary unprotected bit remains unchanged, but now the content of the temporary unprotected sector can be modified.

To restore the protection it needs to reset the micro or to execute another Set protection operation and write 0 into this bit.

3.4) Disable Test Modes

The Test Mode Protections are given by bits TMDIS and PWOK of NVWPR.

| OR | 04000h, #002h | ; Set PROT in FCR |
| LDW | 01FFEh, #05A7Ch | ; Prog NVPWD1-0 |
| OR | 04000h, #080h | ; Set FWMS in FCR |

The first instruction is used to select the Set Protection operation, by setting bit PROT of FCR. The second instruction must be word-wide and it is used to specify the NVPWD1-0 address and the password to be programmed. The third instruction is used to start the operation (setting of bit FWMS of FCR). The second instruction automatically forces TMDIS bit of NVWPR to be programmed.

Once disabled the Test Modes can be enabled again only by repeating the disable test mode sequence with the right Password. If the given data is matching with the programmed password in NVPWD1-0, bit PWOK of NVWPR is programmed and Test Modes are enabled again.

If the given data is not matching, one of bits PWT2-0 of NVAPR is programmed. After three unmatching, trials, when all bits PWT2-0 are programmed, Test Modes are disabled for ever.

Just as an example, hereinafter a program erase controller algorithm for the Flash/EEPROM macrocell 1 is reported. This algorithm uses a call subroutine instruction named CAL and return from subroutine instruction named RET with four nested levels allowed.

Available Instructions:

| | | |
|---|---|---|
| ALT | input | ; Wait for input at 1 |
| CMP | input | ; Compare input and set a Flag if 1 (x3 instructions: three CMPi are existing, CMP1, CMP2, CMP3) |
| JMP | label | ; Jump to label |
| JIF | label | ; Jump to label if Flag = 1 |
| JFN | label | ; Jump to label if Flag = 0 |
| CAL | label | ; Call subr. (Store PC, Inc. SP and Jump to label) |
| CLF | label | ; Call subr. if Flag = 1 |
| RET | | ; Return from subr. (Dec. SP and Jump to stored PC) |
| STO | output | ; Set output at 1 (x5 instructions: 5 STOi instr. are existing, STO1, STO2, ... STO5) {this instr. is used to activate any Output signal of the PEC}; |

Input Variables:
NOTHING=No variables => Realize a NOP with CMP NOTHING;
ALL0=All0 phase active
ALLERASED=All sectors erased
DATOOK=Data verified equal to the target
ENDPULSE=End of Prog or Erase pulse
ERSUSP=Erase Suspended
LASTADD=Last Row or Column
LASTSECT=Last Sector
MAXTENT=a Reached maximum tentative number allowed
NORMOP=Normal Read conditions restored
SOFTP=Soft Program phase active
SUSPREQ=Erase Suspend request pending
TOBEMOD=Sector to be erased or byte to be programmed
VPCOK=Verify voltage reached by Vpcx;
BYTERCY_FF=Flash Byte Prog operation active or RECYCLE test mode
CHIPER_EE=EEPROM Chip Erase operation active
CSERASE_FF=Flash Sector/Chip Erase operation active
NEWERPH0=Erase phase 1–3 active
NEWERPH1=Erase phase 2–3 active
NEEDERASE=Unused sector erase needed
NEEDSWAP=Sector Swap needed
PAGEPG_EE=EEPROM Page Update operation active
PAGENSP_FF=Flash Page Prog operation active or NOSOFTPtest mode
SELPAGE=Selected Page to update
SWAPFAIL=Swap error=>autosuspend needed;
Output Variables:
NOTHING=No variables => Used to reset other variables;
ALL0=Start/Stop All0 phase (toggle)
CUIRES=Reset Command Interface and PEC
ERASE=Start/Stop Erase phase (toggle)
HVNEG=Start Erase pulse
INCCOLM=Increment Column Address
INCROW=Increment Row Address
INCSECT=Increment Sector Address
INCTENT=Increment tentative number
LOADADD=Load column address from RAM BUFFER
LOADSECT=Load sector address from RAM BUFFER
PROGRAM=Start Prog pulse
READSUSP=Stop the clock during erase suspend
RESFLAG=Eliminate current sector from the list to be erased
SOFTP=Start/Stop Soft Program phase (toggle)
STOREADD=Store column address in RAM BUFFER
SWXATVCC=Switch Vpcx at Vcc (read voltage)
VERIFY=Set Verify mode
VPCYON=Switch On/Off Vpcy pump (toggle);
ENDSWAP=Reset NEEDSWAP (toggle)
FORCESWAP=Force NEEDSWAP=1 (toggle)
INCPAGE=Increment Page address
LDDATA=Load data from RAM buffer
LDNVCSS=Load NVCSS address (from hardware)
LDNVESP=Load NVESP address (from hardware)
LDOLDSECT=Load Old sector address (from hardware)
LDPAGE=Load Page address from RAM BUFFER
LDPAGE2=Load Page address from RAM BUFFER (for Sector Swap)
LDVCSS=Load VCSS address (from hardware)
LDVESP=Load VESP address (from hardware)
PAGE=Start/Stop Page Program phase (toggle)
READ=Set/Reset read conditions (toggle)
STOREDATA=Store read data into the RAM buffer
STOREPAGE=Store page address in RAM BUFFER
STOREPAGE2=Store page address in RAM BUFFER (for Sector Swap)
STOREPROT=Store Protection data into the RAM buffer
STORESECT=Store sector address in RAM BUFFER
SWAP=Set/Reset Sector Swap phase (toggle)
WRITEVS=Write Volatile Status;
Possible Operations:
Flash Byte Program (1 nesting level)
Flash Page Program (2 nesting levels)
Flash Chip/Sector Erase (3 nesting levels)
Flash Byte Program while Erase Suspend (4 nesting levels)
Set Protections (2 nesting levels)EEPROM Page Update (4 nesting levels)
EEPROM Chip Erase (4 nesting levels)
CODE SIZE=251 lines;
In this example, only EEPROM Page Update will be described
Main Program:

| | | |
|---|---|---|
| CMP | PAGEPG_EE | ; EEPROM Chip Update op. selected ? |
| JIF | epgupd | ; If yes jump to EEPROM Chip update routine |
| JMP | main | ; If no, then loop |

Subroutines:
1) SDELAY (the PEC Clock is Used to Count a Delay for Analog Signals Settling)

| | | |
|---|---|---|
| CMP | NOTHING | ; NOP: delay cycle |
| CMP | NOTHING | ; NOP: delay cycle |
| CMP | NOTHING | ; NOP: delay cycle |
| CMP | NOTHING | ; NOP: delay cycle |
| RET | | ; 4 NOP + 1 CAL + 1 RET = 6 NOP |

2) Program 1 Byte (Every Byte is Continuously Programmed up to a Positive Verify Test)

sbytepg

| | | |
|---|---|---|
| STO | VERIFY | ; Verify Data to be programmed |
| CMP | DATOOK | ; Compare read data with 00h |
| JIF | sbpend | ; If DATOOK = 1 => Return (the data is already OK) |
| STO | PROGRAM | ; If DATOOK = 0 => Apply Prog pulse |

-continued

| | | |
|---|---|---|
| ALT | ENDPULSE | ; Wait for end of Prog pulse |
| STO | INCTENT | ; If no Increment tentative number |
| CMP | MAXTENT | ; Compare tentative number with maximum allowed |
| JFN | sbytepg | ; If MAXTENT = 0 => Retry |
| sbpend | RET | ; If MAXTENT = 1 || DATOOK = 1 => Return |

3) Program 1 Page spagepg

| | | |
|---|---|---|
| STO | LDDATA | ; Read Data and flag TOBEPROG from RAM buffer |
| CMP | TOBEMOD | ; Byte to be programmed? |
| JFN | sppincc | ; If no increment column |
| sppbyte | | |
| CAL | sbytepg | ; Byte Program |
| sppincc | | |
| STO | INCCOLM | ; Increment Column address |
| CMP | LASTADD | ; Last column? |
| JFN | spagepg | ; If no restart program |
| RET | | ; If yes Return |

4) Program 1 Sector sssectpg

| | | |
|---|---|---|
| CAL | sbytepg | ; Byte Program |
| STO | INCROW | ; Increment row |
| CMP | LASTADD | ; Last Row? |
| JFN | ssectpg | ; If no continue A110 |
| CMP | NOTHING | ; NOP: delay cycle |
| STO | INCCOLM | ; Increment Column address |
| CMP | LASTADD | ; Last column? |
| JFN | ssectpg | ; If no program again |
| RET | | ; If yes Return |

5) ERASE VERIFY 1 SECTOR (the Sector is Erased, Read and Verified Byte After Byte and After Every Erasing Pulse Starting from the Last non Erased Byte; the Subroutine Terminates when the Last Byte of the Sector is Erased)

| | | |
|---|---|---|
| STO | VERIFY | ; Verify Data to be erased |
| CMP | DATOOK | ; Compare read Data with 0FFh |
| JFN | sevend | ; If DATOOK = 0 => Return |
| STO | INCROW | ; If DATOOK = 1 => Increment Row |
| CMP | LASTADD | ; Last Row? |
| JFN | servfy | ; If no continue Erase Verify phase |
| STO | INCCOLM | ; If yes increment Column address |
| CMP | LASTADD | ; Last Column? |
| JFN | servfy | ; If no continue Erase Verify phase |
| STO | RESFLAG | ; If yes the current sector is erased |
| sevend | RET | ; Return |

EEPROM Routines

1) PAGE BUFFER FILLING. This routine is used to fill all not selected addresses of the selected page with the old data written in those locations. Old Data are read from the old locations (using actual EESECT and EEBCK<1:0>, the Volatile registers) using normal read conditions (Vpcx= 4.5V) forced through signal READ.

Once Stored the old data in Ram, the local flag TOBEPROG for that byte is automatically set.

ebuffil

| | | |
|---|---|---|
| STO | READ | ; Enter Read mode conditions |
| ebfloop | | |
| STO | LDDATA | ; Read flag TOBEPROG from RAM buffer |
| CMP | TOBEMOD | ; Byte to be programmed? |
| JIF | ebfincc | ; If yes increment column |
| STO | VERIFY | ; If no Read Old Data (STO3) |
| STO | STOREDATA | ; Store Old Data in Ram Buffer (STO2) |
| ebfincc | | |
| STO | INCCOLM | ; Increment Column address (STO5) |
| CMP | LASTADD | ; Last column? |
| JFN | ebfloop | ; If no continue RAM filling |
| STO | READ | ; If yes exit Read mode |
| RET | | ; Return |

2) NON VOLATILE STATUS PROGRAM. This routine is used to program the Non Volatile Status Pointers NVESP, NVCSS0, NVCSS1.

estprg

| | | |
|---|---|---|
| CAL | sbytepg | ; Non Volatile Status Program |
| CMP | NOTHING | ; NOP: delay cycle |
| RET | | ; Return |

3) PAGE PROGRAM. This routine is used to program a Page taking the data from the RAM buffer. At first not selected page address in the Ram buffer are filled with the last valid data. Then the VIRG bit in NVESP is programmed to notify that the page program operation is started. Then after the page programming, the USED bit in NVESP is programmed to notify that the operation is concluded. At the end also the Volatile Block Pointers are updated

| | | |
|---|---|---|
| STO | STOREPAGE | ; Store current Page Address in RAM |
| CAL | ebuffil | ; Fill-in not selected page address |
| STO | LDNVESP | ; Load New NVESP address for current page |
| CAL | estprg | ; NVESP Program (VIRG bit) |
| STO | LDPAGE | ; Load New Page address from RAM |
| CAL | spagepg | ; Page Program |
| STO | LDNVESP | ; Load New NVESP address for current page |
| CAL | estprg | ; NVESP Program (USED bit) |
| STO | LDVESP | ; Load VESP address for current page (STO2) |
| STO | WRITEVS | ; Write Volatile Status BCK <1:0> (STO3) |
| RET | | ; Return |

4) SECTOR SWAP. This routine is used when in the current sector the 4 blocks for the selected page are already used. In this case the selected page is programmed in the new sector and all the other unselected pages must be swapped to the new sector.

SWAP=1 forces TOBEPROG=0=>in ebuffil routine all the Page data are copied into the RAM buffer CHIPER_EE=1 forces TOBEPROG=1=> in ebuffil routine all the data in the Ram buffer are kept at FFh (reset value).

CHIPER_EE=1 forces SELPAGE=0=> no page selected esecswp

| | | |
|---|---|---|
| STO | SWAP, PAGE | ; Enter Sector Swap (STO4) |
| esspage | | |
| STO | LDPAGE2 | ; Read selected page address from RAM (STO1) |
| CMP | SELPAGE | ; Current page is the selected for update? |

| | | |
|---|---|---|
| JIF | essincp | ; If yes increment page |
| CAL | epagepg | ; If no Page Program |
| essincp | | |
| STO | INCPAGE | ; Increment Page |
| CMP | LASTADD | ; Last Page? |
| JFN | esspage | ; If no swap current page |
| CMP | SWAPFAIL | ; Swap fail? |
| JIF | sexit | ; If yes autosuspend |
| STO | SWAP, PAGE | ; Exit Sector Swap phase |
| RET | | ; Return |

5) PROGRAM ALL0. This routine is used for program All0
This routine automatically program bit ACT of unused sector when the sector swap is done.

| ea1l0 | | |
|---|---|---|
| STO | ALL0 | ; Enter All0 phase (STO4) |
| STO | LDOLDSECT | ; Load Old Sector address (STO1) |
| CAL | ssectpg | ; Sector Program |
| STO | ALL0 | ; Exit All0 phase |
| RET | | ; Return |

6) ERASE. This routine is used for erase. Erase verify is made before the first erase pulse, since during Erase phase 3, the initial cells status is unknown.

| eerase | | |
|---|---|---|
| STO | ERASE | ; Enter Erase phase (STO4) |
| STO | LDOLDSECT | ; Load Old Sector address (STO1) |
| eervfy | | |
| CAL | servfy | ; Erase Verify on all sector |
| CMP | ALLERASED | ; All sector erased? |
| JIF | eerend | ; If yes exit erase phase |
| eerpul | | |
| STO | HVNEG | ; If no apply Erase pulse |
| ALT | ENDPULSE | ; Wait for end of Erase pulse |
| CMP | NOTHING | ; NOP: reset the counter when HVNEG = 1 |
| STO | INCTENT | ; Increment tentative number |
| CMP | MAXTENT | ; Compare tentative number with maximum allowed |
| JFN | eervfy | ; If MAXTENT = 0 => erase verify |
| eerend | | |
| STO | ERASE | ; If MAXTENT = 1 => exit Erase phase |
| RET | | ; Return |

7) SECTOR ERASE. This routine is used to enter the needed erase phase on the unused sector, as explained by the following table:

Erase phase 0 makes the All0 on the second half (status included) (second half is programmed first just because it includes at the end of its 'address space' the NV status, whose bits must be programmed as soon as possible)
Erase phase 1 makes the All0 on the first half
Erase phase 2 makes the Erase with verification of status only
Erase phase 3 completes the Erase

| esecter | | |
|---|---|---|
| STO | LDNVCSS | ; Load NVCSS0 address |
| CAL | estprg | ; NVCSS0 Program (bit EPHS <3:0>) |
| CMP | NEWERPH1 | ; |
| JFN | eseph01 | ; If NEWERPH <1:0> = 0X => Enter Erase Phase 0–1 |
| CAL | eerase | ; If NEWERPH <1:0> = 1X => Enter Erase Phase 2–3 |
| CMP | NEWERPH0 | ; |
| JFN | eseend | ; If NEWERPH <1:0> = 10 => Exit Erase Phase 2–3 |
| eseph01 | | |
| CAL | ea1l0 | ; Program All0 (needed before any erase) |
| eseend | | |
| STO | LDNVCSS | ; Load NVCSS0 address |
| CAL | estprg | ; NVCSS0 Program (bit EPHE <3:0>) |
| STO | LDVCSS | ; Load VCSS0 address (STO2) |
| STO | WRITEVS | ; Write Volatile Status ERPH <1:0> (ST03) |
| CMP | NEEDSWAP | ; |
| JFN | eseret | ; If NEEDSWAP = 0 => exit Sector Erase |
| STO | ENDSWAP | ; If NEEDSWAP = 1 => ENDSWAP resets NEEDSWAP |
| JMP | eseend | ; Program NVCSS1 (CUR bit) and VCSS1 (EESECT) |
| eseret | | |
| RET | | ; Return |

8) PAGE UPDATE. This routine is used to handle all the data transfers between blocks and sectors when an update of a page of the EEPROM is needed

| epgupd | | |
|---|---|---|
| ALT | VPCOK | ; Wait for Vpcx verify voltage (was Read mode) |
| STO | STOREPAGE2 | ; Store Page address in RAM (Sect Swap) (STO2) |
| STO | PAGE | ; Enter Page Program phase (STO4) |
| CAL | epagepg | ; Selected Page Program |
| STO | PAGE | ; Exit Page Program phase |
| CMP | NEEDSWAP | ; EEPROM Sector Swap needed? |
| CLF | esecswp | ; If yes Sector Swap |
| CMP | NEEDERASE | ; Unused Sector Erase needed? |
| CLF | esecter | ; Unused Sector Erase |
| JMP | sexit | ; Exit Page Update |

| EPH <3:0> | EEERPH <1:0> | NEWERPH <1:0> | NEEDSWAP | NEEDERASE | Er. Phase |
|---|---|---|---|---|---|
| 0000 | 11 | 00 | 0 | 0 | None |
| 0000 (1111) | 11 | 00 | 1 | 1 | 0 |
| 1110 | 00 | 01 | 0 | 1 | 1 |
| 1100 | 01 | 10 | 0 | 1 | 2 |
| 1000 | 10 | 11 | 0 | 1 | 3 |
| ; | | | | | |

The memory device and the method according to the invention allow a totally hardware emulation of an EEPROM memory portion.

No access differences are detectable between the emulated memory portion according to the invention and a standard EEPROM memory.

An immediate EEPROM access is available during the reading and writing phases of the emulated memory portion 2.

A further advantage is given by the Flash code execution running during EEPROM modify phase.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An emulated EEPROM memory device, comprising;
   a memory macrocell which is embedded into an integrated circuit having a microcontroller, the memory macrocell including:
   a NOR Flash memory structure formed by a predetermined number of sectors, at least one sector of the NOR Flash memory structure having a selected number of NOR Flash memory cells that are structured to emulate EEPROM byte alterability corresponding to an EEPROM memory array having a selected number of EEPROM memory cells, the selected number of EEPROM memory cells being fewer than the selected number of NOR Flash memory cells.

2. The emulated EEPROM memory device according to claim 1, wherein said EEPROM byte alterability is emulated by hardware means.

3. The emulated EEPROM memory device according to claim 1, wherein 8 Kbyte of the Flash memory structure are used to emulate 1 Kbyte of an EEPROM memory portion.

4. The emulated EEPROM memory device according to claim 1, wherein first and second EEPROM emulated sectors are each divided in a pre-determined number of blocks of the same size and each block is divided in pages.

5. The emulated EEPROM memory device according to claim 2, wherein hardware means includes a state machine for controlling an address counter which has an output connected to an internal address bus running inside the memory macrocell, said address counter receiving control signals from the state machine in order to control the loading of hard-coded addresses in volatile or non-volatile registers which are read and updated by the microcontroller during a reset phase or by the state machine after an EEPROM update.

6. The emulated EEPROM memory device according to claim 5, wherein said internal address bus is connected to the input of a RAM buffer which is used for the page updating of the EEPROM including two additional byte for storing a page address during a page updating phase.

7. The emulated EEPROM memory device according to claim 1, wherein Flash and EEPROM memories operations are controlled through a register interface mapped into the memory.

8. A method for emulating features of an EEPROM memory device incorporated into a memory macrocell which is embedded into an integrated circuit that also includes a microcontroller and a NOR Flash memory structure formed by a predetermined number of sectors, comprising using at least two sectors of the NOR Flash memory structure to emulate EEPROM byte alterability by dividing each of said at least two sectors into a predetermined number of blocks of the same size and each block into a predetermined number of pages and updating the emulated EEPROM memory portion programming different memory locations in a single bit mode, wherein at a page update selected page data are moved to a next free block and, when an emulated EEPROM sector is full, all the pages are swapped to another emulated EEPROM sector.

9. A NOR Flash memory device for emulating an EEPROM, comprising:
   first and second NOR Flash memory portions each including plural memory blocks with plural memory locations, each of the memory locations sharing an address with a corresponding memory location in each of the blocks of the first and second NOR Flash memory portions, all of the memory locations sharing a same address being a set of memory locations; and
   a plurality of memory pointers each reflecting which memory block includes a current memory location for a set of memory locations, each set of memory locations including a current memory location;
   a memory controller structured to, in response to receiving a request to write data to a selected address assigned to a selected one of the sets of memory locations, determine from a memory pointer associated with the selected address which memory location in the selected set is a next memory location following the current memory location for the selected set and write the data in the next memory location;
   an internal address bus running inside the memory macrocell;
   an address counter having an output connected to the internal address bus; and
   a state machine for controlling the address counter, said address counter receiving control signals from the state machine in order to control the loading of hard-coded addresses such that the corresponding pages always share the same non-changeable address.

10. The NOR Flash memory device of claim 9 wherein the first and second NOR Flash memory portions are part of first and second memory sectors, the first memory sector including a first set of the plurality of memory pointers associated with the first NOR Flash memory portion and the second memory sector including a second set of the plurality of memory pointers associated with the second NOR Flash memory portion.

11. The NOR Flash memory device of claim 9 wherein each block includes a plurality of memory pages with each memory page including a plurality of the memory locations and each of the memory pointers is a page pointer associated with a respective one of the memory pages.

12. The NOR Flash memory device of claim 11 wherein the plurality of NOR Flash memory portions include two NOR Flash memory portions, each with four memory blocks, each memory block including 64 memory pages each with 16 memory locations that are able to store a data byte.

13. The NOR Flash memory device of claim 9, further including a third Flash memory portion not organized to emulate the EEPROM.

14. The NOR Flash memory de vice of claim 13, further including first and second sense amplifiers, the first sense amplifier being coupled to, and structured to read, the first and second NOR Flash memory portions and the second sense amplified being coupled to, and structured to read, the third NOR Flash memory portion.

15. A method of emulating an EEPROM using NOR Flash memory, the method comprising:

dividing the NOR Flash memory into first and second memory sectors each including a plurality of memory blocks, each memory block including plural memory pages each with plural memory locations;

assigning to each memory page of the first and second memory sectors a page address that is shared by a corresponding page in each of the memory blocks of the first and second memory sector s wherein such assignment is hard-coded such that the corresponding pages always share the same non-changeable address;

in response to a first write instruction to write to a selected page address, writing to a data page of a first memory block of the first memory sector, and updating a state machine to indicate that the first memory block of the first memory sector contains valid data;

in response to a second write instruction to write data to the selected page address, writing to a data page of a second memory block of the first memory sector, updating the state machine to indicate that the first memory block of the first memory sector contains invalid data, and updating the state machine to indicate that the second memory block of the first sector contains valid data; and in response to a read instruction to read data from the selected page address, determining from the state machine which memory block contains valid data, and reading the data page corresponding to the memory block containing valid data.

16. The method of claim 15, further comprising, in response to a third write instruction to write to the selected page address when a most recent write instruction to write to the selected page address was executed by writing to a last memory block of the first memory sector, executing the third write instruction by writing to a first memory block of the second memory sector.

17. The method of claim 15 wherein all memory pages sharing a same page address constitute a set of memory pages, the number of sets of memory pages equaling how many memory pages are in each memory block, the method further comprising:

assigning to each set of memory pages of the first and second memory sectors a page pointer that reflects which memory page in the set has been most recently updated; and in response to each write instruction requesting to write data to the selected page address, determining which page pointer is associated with the selected page address, determining from the page pointer associated with the selected page address which memory page of the set of memory pages assigned the selected page address is next to be updated, and writing the data in the memory page that is determined to be the next memory page to be updated.

18. The method of claim 15, further comprising erasing the second memory sector while updating memory pages of the first memory sector.

19. The method of claim 18 wherein the erasing act is performed in plural erase phases, with each of the erase phases being triggered by writing data in the first memory sector.

20. The emulated EEPROM of claim 1 wherein the ratio of NOR Flash cells used to emulate one EEPROM memory cell is 8 to 1.

21. An emulated EEPROM memory array comprising:

a NOR flash memory array located on an integrated circuit, the NOR flash memory array being organized into a plurality of sectors for emulating EEPROM byte alterability a microcontroller coupled for controlling data access to and from an addressing of the flash memory array;

an address counter whose output is coupled to an internal address bits of the memory array for tracking and controlling the address at which emulated EEPROM data is stored; and a state machine coupled to the address counter and coupled for outputting control signals, the address counter receiving control signals from the state machine to control the loading of hard coded addresses in storage registers which are read and updated by the microcontroller during a reset phase or by the state machine after an EEPROM update.

22. An emulated EEPROM memory array comprising:

a NOR Flash memory array located on an integrated circuit, the NOR Flash memory array being organized into a plurality of sectors;

a microcontroller coupled for controlling data access to and from an addressing of the flash memory array;

an address counter whose output is coupled to an internal address bus of the memory array; and a state machine coupled to the address counter and coupled for outputting control signals the address counter receiving control signals from the state machine to control the loading of hard coded addresses in storage registers which are read and updated by the micro controller during a reset phase or by the state machine after an EEPROM update wherein said storage registers is a RAM buffer which is coupled for page updating of the EEPROM, the RAM buffer including sufficient storage for storing a page address of the memory array during a page update phase.

23. An emulated EEPROM memory comprising:

a NOR flash memory array positioned on an integrated circuit, the NOR flash structure being of the type that permits simultaneous erasing of all cells in an entire sector but does not permit simultaneous erasing of less than all cells in a sector, at least two of the sectors being structured to emulate an EEPROM having byte erasability, the emulated EEPROM bytes comprising substantially fewer memory cells than an entire sector.

24. An emulated EEPROM memory device, comprising;

a memory macrocell which is embedded into an integrated circuit having a microcontroller, the memory macrocell including:

a Flash memory structure formed by a predetermined number of sectors, at least one sector of the Flash memory structure having a selected number of Flash memory cells that are structured to emulate EEPROM byte alterability corresponding to an EEPROM memory array having a selected number of EEPROM memory cells, the selected number of EEPROM memory cells being fewer than the selected number of Flash memory cells, wherein said EEPROM byte alterability is emulated by hardware means, wherein hardware means includes a state machine for controlling an address counter which has an output connected to an internal address bus running inside the memory macrocell, said address counter receiving control signals from the state machine in order to control the loading of hard-coded addresses in volatile or non-volatile registers which are read and updated by the microcontroller during a reset phase or by the state machine after an EEPROM update, wherein said internal address bus is connected to the input of a RAM buffer which is used for the page updating of the EEPROM including two additional byte for storing a page address during a page updating phase.

25. A Flash memory device for emulating an EEPROM, comprising:

first and second Flash memory portions each including plural memory blocks with plural memory locations, each of the memory locations sharing an address with a corresponding memory location in each of the blocks of the first and second Flash memory portions, all of the memory locations sharing a same address being a set of memory locations; and a plurality of memory pointers each reflecting which memory block includes a current memory location for a set of memory locations, each set of memory locations including a current memory location;

a memory controller structured to, in response to receiving a request to write data to a selected address assigned to a selected one of the sets of memory locations, determine from a memory pointer associated with the selected address which memory location in the selected set is a next memory location following the current memory location for the selected set and write the data in the next memory location; and a third Flash memory portion not organized to emulate the EEPROM.

26. The Flash memory device of claim 25, further including first and second sense amplifiers, the first sense amplifier being coupled to, and structured to read, the first and second Flash memory portions and the second sense amplifier being coupled to, and structured to read, the third Flash memory portion.

* * * * *

UNITED STATES PATENT AND TRADEMARK OFFICE
CERTIFICATE OF CORRECTION

PATENT NO. : 6,904,400 B1
DATED : June 7, 2005
INVENTOR(S) : Maurizio Peri et al.

It is certified that error appears in the above-identified patent and that said Letters Patent is hereby corrected as shown below:

Column 20,
Line 62, "memory de vice" should read as -- memory device --.
Line 66, "sense amplified" should read as -- sense amplifier --.

Column 21,
Line 10, "memory sector s" should read as -- memory sectors --.

Column 22,
Lines 4 and 5, "byte alterability" should read as -- byte alterability; --.
Line 9, "address bits" should read as -- address bus --.

Signed and Sealed this

Eleventh Day of October, 2005

JON W. DUDAS
*Director of the United States Patent and Trademark Office*